United States Patent
Ichiyama et al.

(10) Patent No.: US 7,496,137 B2
(45) Date of Patent: Feb. 24, 2009

(54) APPARATUS FOR MEASURING JITTER AND METHOD OF MEASURING JITTER

(75) Inventors: Kiyotaka Ichiyama, Tokyo (JP); Masahiro Ishida, Tokyo (JP); Takahiro Yamaguchi, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 632 days.

(21) Appl. No.: 11/137,786

(22) Filed: May 25, 2005

(65) Prior Publication Data

US 2006/0268970 A1    Nov. 30, 2006

(51) Int. Cl.
  *H04B 3/46* (2006.01)
(52) U.S. Cl. ............... 375/226; 375/376; 375/224; 710/100; 702/111; 702/69; 327/3
(58) Field of Classification Search ........... 375/376, 375/226, 224; 370/516; 710/100; 702/111, 702/69; 327/3
  See application file for complete search history.

(56) References Cited

U.S. PATENT DOCUMENTS

| 6,259,755 | B1* | 7/2001 | O'Sullivan et al. | 375/376 |
| 6,952,431 | B1* | 10/2005 | Dally et al. | 370/516 |
| 7,313,496 | B2* | 12/2007 | Ishida et al. | 702/111 |
| 2002/0133650 | A1* | 9/2002 | Dreps et al. | 710/100 |
| 2003/0020514 | A1* | 1/2003 | Takeo et al. | 327/3 |
| 2005/0075810 | A1* | 4/2005 | Laquai | 702/69 |
| 2005/0185708 | A1* | 8/2005 | Yamaguchi et al. | 375/224 |
| 2006/0182170 | A1* | 8/2006 | Ichiyama et al. | 375/226 |
| 2006/0251162 | A1* | 11/2006 | Yamaguchi et al. | 375/226 |
| 2007/0118314 | A1* | 5/2007 | Ichiyama et al. | 702/69 |

* cited by examiner

*Primary Examiner*—Sudhanshu C Pathak
(74) *Attorney, Agent, or Firm*—Osha • Liang LLP

(57) ABSTRACT

There is provided a jitter measuring apparatus for measuring jitter in a signal-under-measurement, including a pulse generating section having first pulse generating means for detecting edges of the data-signal-under-measurement to output a first pulse signal having a pulse width set in advance corresponding to the edge and second pulse generating means for detecting boundaries of data sections where data values do not change in the data-signal-under-measurement to output a second pulse signal having a pulse width set in advance over the edge timings of the boundaries of the detected data sections and a jitter calculating section for calculating timing jitter in the data-signal-under-measurement based on the first and second pulse signals.

20 Claims, 21 Drawing Sheets

APPARATUS FOR MEASURING JITTER AND METHOD OF MEASURING JITTER

BACKGROUND OF THE INVENTION

1. Field of the Invention

The present invention relates to a measuring apparatus and a measuring method for measuring timing jitter in a data signal-under-measurement.

2. Description of Related Art

Conventionally, as a circuit for measuring timing jitter in a clock-signal-under-measurement, there has been known a circuit for measuring timing jitter by delaying the clock-signal-under-measurement by one period and by detecting a phase difference between the clock-signal-under-measurement and the delayed signal for example.

It has been also known to be able to measure jitter in a clock-signal -under-measurement by using a sampling oscilloscope and a digital oscilloscope.

However, although the conventional jitter measuring method is effective in measuring timing jitter in a pulse signal having a constant period such as the clock signal, it is unable to accurately measure timing jitter in a signal in which logic values appear irregularly such as a data signal.

For instance, while it is necessary to generate a triggering signal for measuring a phase of edges of the data-signal-under-measurement to measure timing jitter by using the sampling oscilloscope, the digital oscilloscope or the like, triggering signals of various timing have to be generated because the edges of the data signal are positioned irregularly. Therefore, timing jitter in the triggering signal itself becomes large, worsening the accuracy for measuring jitter in the data-signal-under-measurement.

Still more, because a high-precision circuit is required to generate triggering signals having less timing jitter, the measuring cost increases.

Therefore, it was unable to measure timing jitter in the data signal whose pattern is irregular at low cost and accurately by the conventional methods. Still more, neither method nor circuit for measuring jitter in a data signal in real-time has been invented yet.

Accordingly, it is an object of the invention to provide a jitter measuring apparatus and a jitter measuring method that are capable of solving the above-mentioned problems. This object may be achieved through the combination of features described in independent claims of the invention. Dependent claims thereof specify preferable embodiments of the invention.

SUMMARY OF INVENTION

In order to solve the above-mentioned problem, according to a first aspect of the invention, there is provided a jitter measuring apparatus for measuring jitter in a signal-under-measurement including a pulse generating section having first pulse generating means for detecting edges of the data-signal-under-measurement to output a first pulse signal having a pulse width set in advance corresponding to the edge and second pulse generating means for detecting boundaries of data sections where data values do not change in the data-signal-under-measurement to output a second pulse signal having a pulse width set in advance corresponding to timing of the boundaries of the detected data sections and a jitter calculating section for calculating timing jitter in the data-signal-under-measurement based on the first and second pulse signals.

The jitter measuring apparatus may further include a complementary data signal generating section for generating a complementary data signal having edges at every boundary of the data sections of the data-signal-under-measurement over which the data values of the data-signal-under-measurement do not change, and the second pulse generating means may output the second pulse signal corresponding to the edge of the complementary data signal.

The complementary data signal generating section may generate the complementary data signal by which the edges of the data-signal-under-measurement and of the complementary data signal are arranged at almost equal intervals when they are aligned in the same time axis.

The jitter measuring apparatus may further include an integrator section for outputting a jitter measuring signal whose signal level increases at a predetermined rate of increment during when the signal outputted from the pulse generating section indicates a first logic value and whose signal level decreases at a predetermined rate of decrement during when the signal outputted from the pulse generating section indicates a second logic value which is different from the first logic value, and the jitter calculating section calculates the timing jitter based on each of the signal level of the jitter measuring signal outputted from the integrator section at the timing of edge of the pulse signal.

The jitter calculating section may have a sample-and-hold circuit for passing the jitter measuring signal during when the first pulse signal indicates the first logic value and holding the signal level of the jitter measuring signal during when the first pulse signal indicates the second logic value and a calculating section for calculating the timing jitter based on the signal outputted from the sample-and-hold circuit.

The jitter calculating section may have an AD converter section for receiving the first pulse signal as a conversion triggering signal and converting the signal level of the jitter measuring signal into a discrete value corresponding to the conversion triggering signal and a calculating section for calculating the timing jitter based on the digital value outputted from the AD converter section.

Preferably, the data-signal-under-measurement is a signal that repeats a same data pattern periodically with the period of a pattern set in advance and the jitter calculating section may have a sample-and-hold circuit for passing the jitter measuring signal during when pulses of the first pulse signal whose order is set in advance indicates the first logic value and holding the signal level of the jitter measuring signal during when the pulse does not indicate the first logic value and a calculating section for calculating the timing jitter based on the signal outputted from the sample-and-hold circuit.

The sample-and-hold circuit may sequentially select the pulse for sampling the jitter measuring signal and the calculating section calculates the timing jitter of the selected pulse and further calculates deterministic jitter in the data-signal-under-measurement based on each of the calculated timing jitter.

Preferably, the data-signal-under-measurement is a signal that repeats a same data pattern periodically with the period of a pattern set in advance and the jitter measuring device may also have a frequency divider for dividing the data-signal-under-measurement corresponding to a number of data transitions in each pattern period of the data-signal-under-measurement and the complementary data signal generating section generates the complementary data signal of the divided data-signal-under-measurement.

The pulse generating section may generate the pulse signal responding to the change in either or both of the rising edge and falling edge of the data-signal-under-measurement and the complementary data signal.

The complementary data signal generating section may have a clock regenerator for generating a clock signal having the almost equal period with the data section of the data-signal-under-measurement based on the data-signal-under-measurement, a first D flip-flop for taking in and outputting the data-signal-under-measurement with each clock signal, a second D flip-flop for taking in and outputting the signal outputted from the first D flip-flop with each clock signal, an coincidence detector for outputting an coincident signal having a logic value H to indicate the state that a value of the signal outputted from the first D flip-flop is equal to a value of the signal outputted from the second D flip-flop, a third D flip-flop for taking in and outputting the signal outputted from the coincidence detector with each clock signal and by which internal data is reset, a frequency divider for dividing the signal outputted from the third D flip-flop by two to generate the complementary data signal.

The complementary data signal generating section has a clock regenerator for generating a clock signal having the almost equal period with the data section of the data-signal-under-measurement based on the data-signal-under-measurement, a fourth D flip-flop in which the clock signal is applied to a clock input terminal and an inverting output terminal is connected with a data input terminal, a fifth D flip-flop that takes in and outputs the data-signal-under-measurement with each clock signal and an exclusive OR gate for outputting an exclusive OR of the signal outputted from the fourth D flip-flop and the signal outputted from the fifth D flip-flop as the complementary data signal.

The jitter calculating section may calculate the timing jitter based on respective extreme values in the varying signal level of the jitter measuring signal.

The integrator section may generate the jitter measuring signal with the rates of increment and decrement so that the respective extreme values of the jitter measuring signal become the signal level set in advance when the data-signal-under-measurement and the complementary data signal are jitter-free and the jitter calculating section may calculate the timing jitter based on each of the extreme values of the jitter measuring signal and the signal level set in advance.

Preferably, the jitter calculating section has an averaging circuit for removing high-frequency components set in advance from the jitter measuring signal outputted out of the integrator section.

The complementary data signal generating section may generate the complementary data signal whose timing jitter is almost zero.

According to a second aspect of the invention, there is provided a jitter measuring method for measuring jitter in a data-signal-under-measurement, having a first pulse generating step of detecting edges of the data-signal-under-measurement to output a first pulse signal having a pulse width set in advance corresponding to the edges, a second pulse generating step of detecting boundaries of data sections where data values do not change in the data-signal-under-measurement to output a second pulse signal having a pulse width set in advance corresponding to timing of the boundary of the detected data sections and a jitter calculating step of calculating timing jitter in the data-signal-under-measurement based on the first and second pulse signals.

According to a third aspect of the invention, there is provided a jitter measuring apparatus for measuring jitter in a data-signal-under-measurement, having a measuring section capable of measuring jitter in a clock signal having pulses almost in the same period with a data section of the data-signal-under-measurement and an input section for receiving a complementary data signal having edges at every boundary of data sections of the data-signal-under-measurement over which the data values of the data-signal-under-measurement do not change and the data-signal-under-measurement and for inputting the data-signal-under-measurement and the complementary data signal being synchronous with each other to the measuring section.

According to a fourth aspect of the invention, there is provided a jitter measuring method for measuring jitter in a data-signal-under-measurement by using a jitter measuring device capable of measuring timing jitter in a given clock signal, having an input step of inputting a complementary data signal having edges at every boundary of the data sections of the data-signal-under-measurement over which the data values of the data-signal-under-measurement do not change in synchronism with the data-signal-under-measurement to the jitter measuring device and a jitter calculating step of calculating timing jitter in the data-signal-under-measurement by the jitter measuring device based on the data-signal-under-measurement and the complementary data signal.

The input step may be a step of inputting the complementary data signal generated by a device being external to the jitter measuring device to the jitter measuring device. Still more, the input step may include a skew reducing step of reducing a skew between the data-signal-under-measurement and the complementary data signal.

It is noted that the summary of the invention described above does not necessarily describe all necessary features of the invention. The invention may also be a sub-combination of the features described above.

BRIEF DESCRIPTION OF THE DRAWINGS

FIGS. 3A and 3B are charts showing exemplary jitter measuring signals outputted from an integrator section, wherein FIG. 3A shows a case when a data-signal-under-measurement and a complementary data signal are jitter-free and FIG. 3B shows a case when the data-signal-under-measurement and the complementary data signal are jittery.

FIGS. 8A and 8B are timing charts showing one exemplary operation of the complementary data signal generating section, wherein FIG. 8A shows the operation from a clock regenerator to a coincidence detector and FIG. 8B shows the operation from the coincidence detector to a frequency divider.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
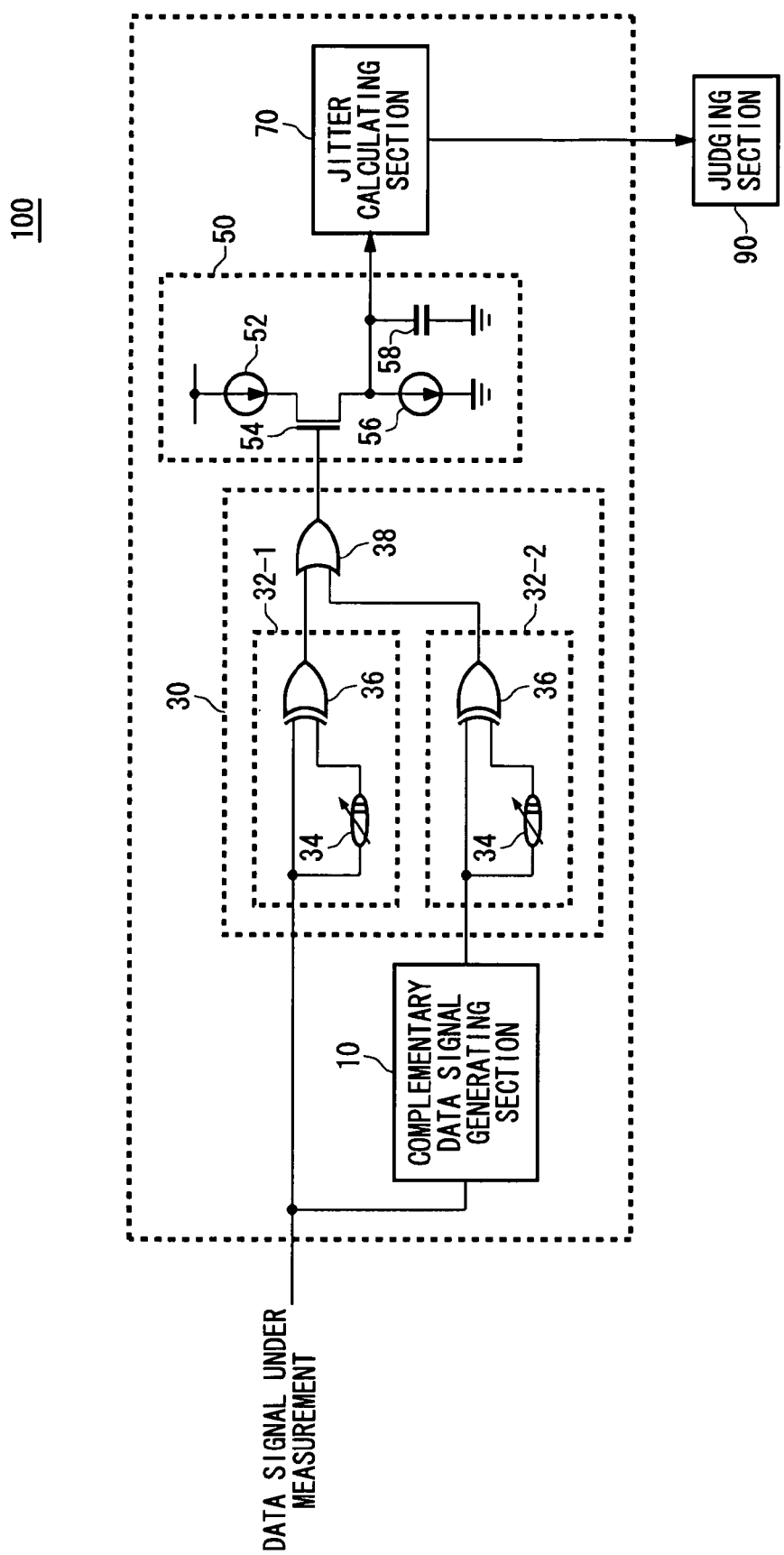
FIG. 1 is a diagram showing one exemplary configuration of a test apparatus according to an embodiment of the invention.

FIG. 1 is a diagram showing one exemplary configuration of a test apparatus 100 according to an embodiment of the invention. The test apparatus 100 is an apparatus for judging whether or not a device-under-test such as a semiconductor circuit is defect-free by measuring jitter in a data-signal-under-measurement outputted from the device-under-test and is provided with a jitter measuring device 98 and a judging section 90. The data-signal-under-measurement is a signal having an almost constant data rate.

The jitter measuring device 98 is a device for measuring jitter in a given data-signal-under-measurement and has a complementary data signal generating section 10, a pulse generating section 30, an integrator section 50 and a jitter calculating section 70.

Based on jitter values of the data signal measured by the jitter measuring device 98, the judging section 90 judges whether or not the device-under-test that has outputted the data-signal-under-measurement is defect-free. For instance, the judging section 90 judges whether or not the device-under-test is defect-free based on if the jitter values in the data-signal-under-measurement falls within a range set in advance.

Figure 2:
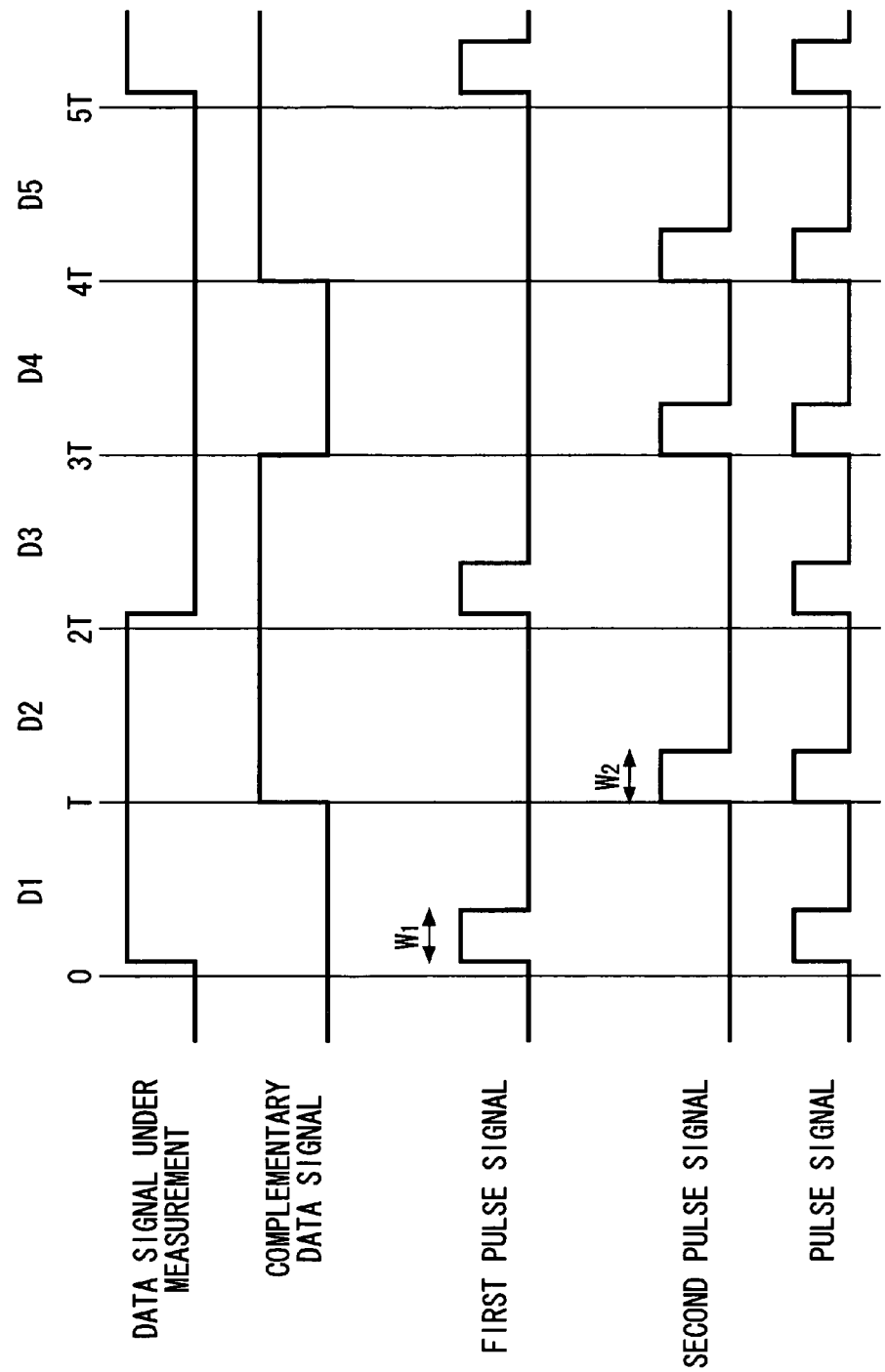
FIG. 2 is a timing chart showing one exemplary operation of a complementary data signal generating section and a pulse generating section.

FIG. 2 is a timing chart showing one exemplary operation of the complementary data signal generating section 10 and the pulse generating section 30. Receiving the data-signal-under-measurement, the complementary data signal generating section 10 generates a data signal complementary to the data-signal-under-measurement. The complementary data signal is a signal having edges at every boundary of data sections over which, since data values of the data-signal-under-measurement do not change, the data-signal-under-measurement has no edge. For instance, when the edges of the data-signal-under-measurement and those of the complementary data signal are aligned on the same time axis, the complementary data signal may be what the aligned edges of the both data-signal-under-measurement and complementary data signal are spaced at the almost same time intervals. The data section of the data-signal-under-measurement is a time interval during which non-repeating single data is held in the serially transmitted data-signal-under-measurement for example. It may be also a time interval during which symbol data is held in a transmitted multi-valued data-signal-under-measurement. That is, the data section may be a bit interval or a symbol interval of the data-signal-under-measurement. In FIG. 2 for example, the time interval of the data section of the data-signal-under-measurement is T and its data pattern during a time (0-6T) is 110001.

In the example shown in FIG. 2, sections (0-T, T-2T, 2T-3T, etc.) correspond to the data sections (D1, D2, D3, etc.), respectively. (0, T, 2T, 3T, etc.) are the boundaries of the ideal data sections of the jitter-free data signal. In this example, the data values of the data-signal-under-measurement change at the boundaries (0, 2T and 5T) of the data sections and do not change at the boundaries (T, 3T and 4T) of the data sections. Accordingly, the complementary data signal generating section 10 generates the complementary data signal having edges at the boundaries (T, 3T and 4T) of the data sections where no edge of the data-signal-under-measurement exists.

Because the data-signal-under-measurement has the data sections with almost constant time intervals, timing of the edge of the data-signal-under-measurement almost coincides with either one of the timings (0, T, 2T, etc.). In such a case, preferably the complementary data signal generating section 10 generates the complementary data signal having edges at the boundaries of the data sections where there exists no edge of the data-signal-under-measurement. Thereby, in terms of the edges of the both data-signal-under-measurement and complementary data signal, the edges are spaced at almost constant intervals. Through such operations, the jitter measuring device 98 can measure and operate with almost constant intervals and can measure jitter accurately by reducing variance of measured values which is otherwise caused due to the different time intervals.

Corresponding to the respective edges of the data-signal-under-measurement and the complementary data signal, the pulse generating section 30 outputs pulse signals having a predetermined pulse width. In this example, the pulse generating section 30 has a first pulse generator 32-1 and a second pulse generator 32-2 corresponding to the data-signal-under-measurement and the complementary data signal and an OR gate 38. The first pulse generator 32-1 may work as first pulse generating means of the invention and the second pulse generator 32-2 may work as second pulse generating means of the invention.

The first and second pulse generators 32-1 and 32-2 have a delay circuit 34 and an exclusive OR gate 36, respectively. Preferably, a delay time of the delay circuit 34 is variable. Receiving the data-signal-under-measurement or the complementary data signal, the delay circuit 34 delays them by a delay time set in advance. The exclusive OR gate 36 outputs an exclusive OR with the data-signal-under-measurement or the complementary data signal and the signal delayed by the delay circuit 34.

Having such configuration, the first pulse generator 32-1 outputs a first pulse signal having a predetermined pulse width W1 corresponding to the respective edges of the data-signal-under-measurement and the second pulse generator 32-2 outputs a second pulse signal having a predetermined pulse width W2 corresponding to the respective edges of the complementary data signal as shown in FIG. 2. The OR gate 38 outputs an OR-ed signal of the first and second pulse signals as shown in FIG. 2.

Figures 3A, 3B:
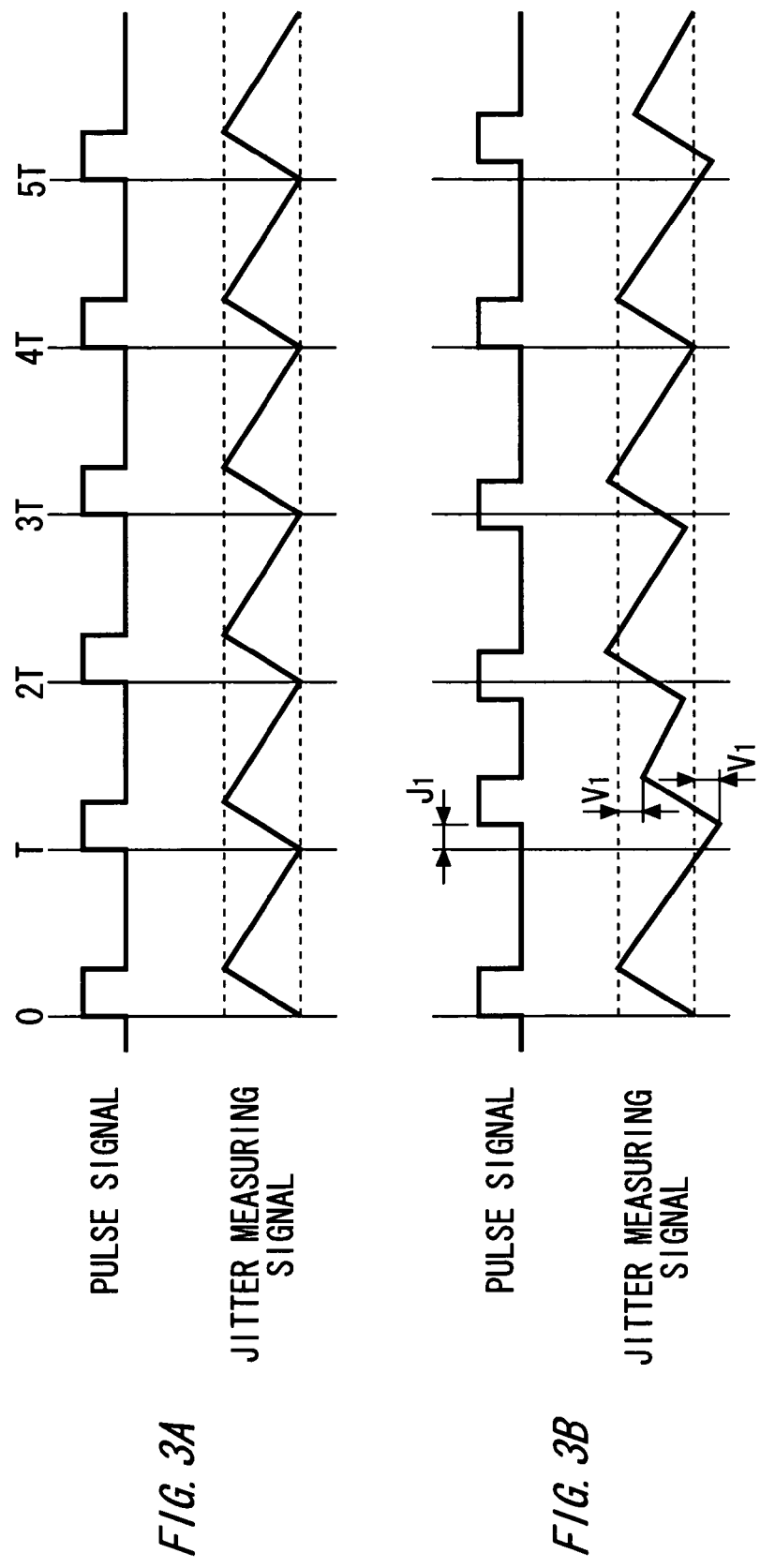

FIGS. 3A and 3B are timing charts explaining one exemplary operation of the integrator section 50. It is assumed that the pulse width W1 of the first pulse signal is equal to the pulse width W2 of the second pulse signal in this example. That is, a case when the pulse generating section 30 outputs the pulse signals having the constant pulse width will be explained here. An embodiment in which the pulse width W1 is not equal to the pulse width W2 will be described later with reference to FIG. 12.

The integrator section 50 outputs a jitter measuring signal whose signal level increases at a predetermined rate of increment during when the signal outputted from the pulse generating section 30 indicates a first logic value and whose signal level decreases at a predetermined rate of decrement during when the signal outputted from the pulse generating section 30 indicates a second logic value that is different from the first logic value. Here, the first logic value is a logic value H and the second logic value is a logic value L.

The integrator section 50 has a current source 52, a current sink 56, a capacitor 58 and a charge/discharge control section 54 as shown in FIG. 1. The current source 52 generates a source current determining the rate of increment of the jitter measuring signal and the current sink 56 generates a sink current determining the rate of decrement of the jitter measuring signal. The capacitor 58 generates voltage level of the jitter measuring signal by being charged/discharged by the current source 52 and the current sink 56.

Still more, the charge/discharge control section 54 charges the capacitor 58 based on a difference current obtained by subtracting the sink current from the current source when the pulse signal indicates the logic value H and discharges the capacitor based on the sink current during when the pulse signal indicates the logic value L.

Having such configuration, the integrator section 50 outputs the jitter measuring signal.

FIG. 3A is a chart showing one example of the jitter measuring signal outputted from the integrator section 50 when the data-signal-under-measurement and the complementary data signal are jitter-free. As shown in FIG. 3A, the integrator section 50 generates the jitter measuring signal with the rates of increment and decrement by which respective extreme values of the changed signal level of the jitter measuring signal fall into signal levels set in advance when the data-signal-under-measurement and complementary data signal are jitter-free. The integrator section 50 generates the jitter measuring signal with the rate of increment of a1 and the rate of decrement of a2 satisfying the following equation:

$$a1 \times W + a2 \times (T-W) = 0$$

where, W is a time interval during which each pulse in the pulse signal indicates the logic value H, i.e., the pulse width, a1 is the rate of increment of the signal level when the pulse signal indicates the logic value H and a2 is the rate of decrement of the signal level when the pulse signal indicates the logic value L.

Under such control, the maximum and minimum values of the jitter measuring signal become constant, respectively, when the both data-signal-under-measurement and complementary data signal are jitter-free.

FIG. 3B shows one example of the jitter measuring signal outputted from the integrator section 50 when the both data-signal-under-measurement and complementary data signal are jittery. Although the timing of the ideal rising edge of the respective pulses of the pulse signal should be (0, T, 2T, etc.), the timing of the rising edge of the actual pulse deviates from such timing (0, T, 2T, etc.) when the data-signal-under-measurement or the complementary data signal is jittery.

For instance, when the rising edge of the pulse corresponding to the timing T has a timing jitter J1, an extreme value corresponding to that pulse among extremes in the jitter measuring signal deviates V1 from the jitter-free constant value described above. This deviation is what the timing jitter J1 is multiplied by the rate of decrement of a2 and is therefore proportional to the timing jitter J1.

The jitter calculating section 70 calculates the timing jitter in the data-signal-under-measurement based on the pulse signal outputted from the integrator section 50. For instance, the jitter calculating section 70 may calculate the jitter values in the data-signal-under-measurement from the respective extreme values of the jitter measuring signal. For example, the jitter calculating section 70 may calculate the timing jitter values of the edges of the data-signal-under-measurement corresponding to the respective extreme values based on a difference between the signal level of the respective extreme values and a reference value set in advance. However, the signal level of the extreme values of the jitter measuring signal fluctuates when the complementary data signal is jittery. Accordingly, it is preferable to calculate jitter values from the jitter measuring signal accurately by removing the effect of the jittery complementary data signal from the jitter measuring signal.

For instance, the complementary data signal generating section 10 may generate a complementary data signal having almost no timing jitter. In this case, the complementary data signal generating section 10 may generate the complementary data signal corresponding to a clock, which is almost jitter-free, generated by means of a high-precision oscillator. Using such complementary data signal can reduce the effect of the jitter in the complementary data signal on the jitter measuring signal.

Still more, the jitter calculating section 70 may calculate the timing jitter based on the extreme values, which are corresponding to the edges of the data-signal-under-measurement, in the jitter measuring signal. For example, the jitter calculating section 70 may calculate the timing jitter values based on the respective signal levels of the jitter measuring signal outputted from the integrator section 50 at the timing of the edges of the pulse signal.

The jitter calculating section 70 may also calculate period jitter in the data-signal-under-measurement by calculating a difference of two adjacent values of the respective timing jitters calculated in time series. For instance, the jitter calculating section 70 can calculate the period jitter in the data-signal-under-measurement by calculating the difference of the adjacent timing jitters series, which is obtained for every period of the data-signal-under-measurement.

Figure 4:
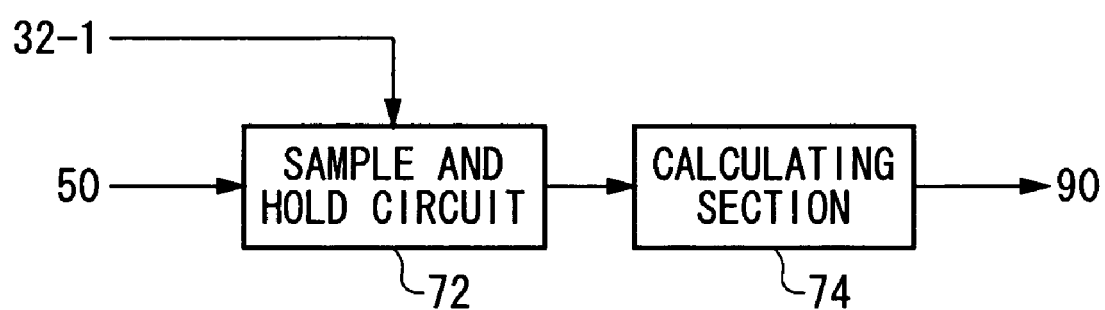
FIG. 4 is a diagram showing one exemplary configuration of a jitter calculating section.

FIG. 4 is a diagram showing one exemplary configuration of the jitter calculating section 70. The jitter calculating section 70 has a sample-and-hold circuit 72 and a calculating section 74 in this example. The sample-and-hold circuit 72 removes the jitter component of the complementary data signal from the jitter measuring signal by passing or holding the signal level of the jitter measuring signal using the first pulse signal.

Figure 5:
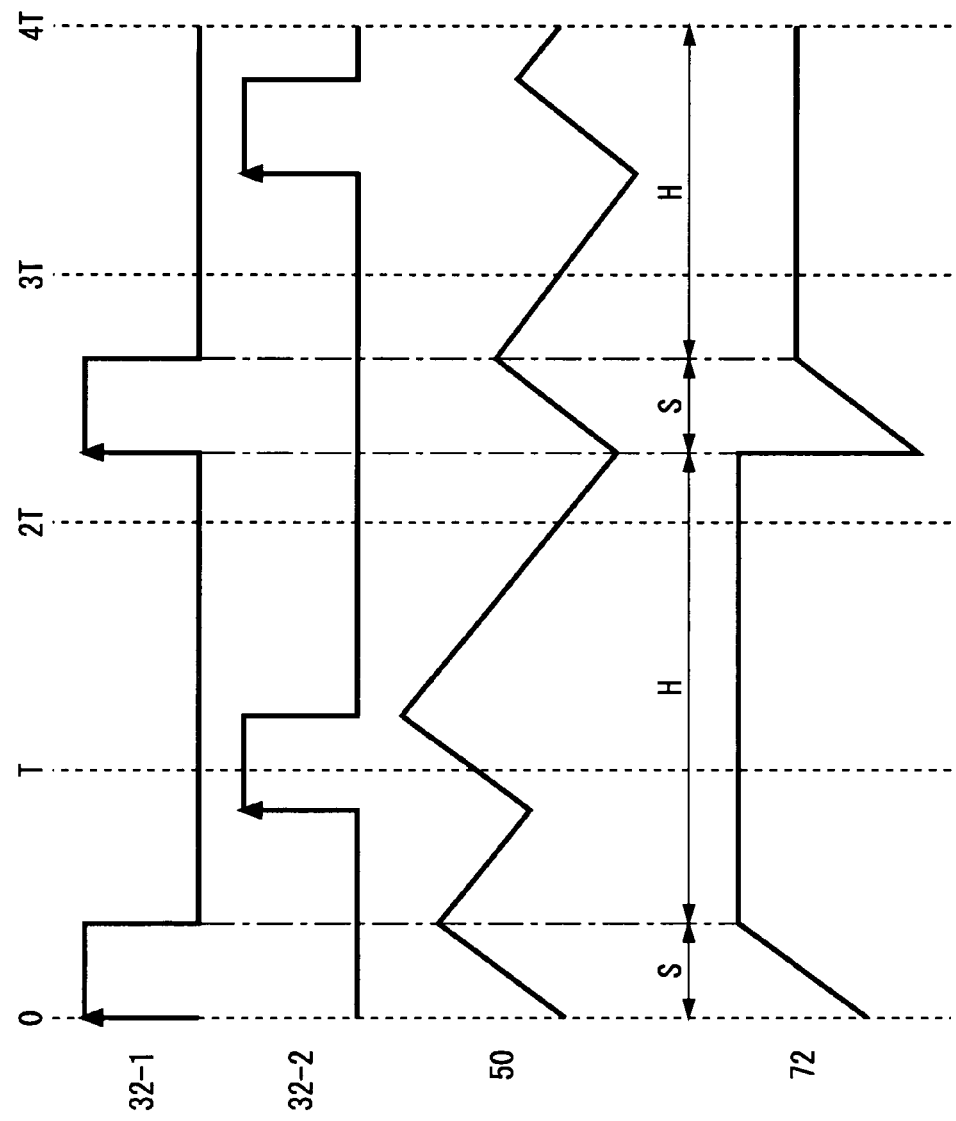
FIG. 5 is a chart showing one exemplary operation of a sample-and-hold circuit.

FIG. 5 shows one exemplary operation of the sample-and-hold circuit 72. As shown in FIG. 5, the sample-and-hold circuit 72 passes the jitter measuring signal during when the first pulse signal outputted from the first pulse generator 32-1 indicates the first logic value (logic value H in this case) and holds the signal level of the jitter measuring signal and supplies it to the calculating section 74 during when the first pulse signal indicates the second logic value (logic value L in this case).

When the complementary data signal is jittery, the timing of the edges of the second pulse signal outputted from the second pulse generator 32-2 deviate from the timing (0, T, 2T, etc.) as shown in FIG. 5. However, the signal level of the jitter measuring signal increases with the constant rate of increment and decreases with the constant rate of decrement in each period. Accordingly, even if, due to the jitter in the second pulse signal, position of pulses of the second pulse signal fluctuates between the pulses of the first pulse signal, the difference in the signal levels of the jitter measuring signal from the falling edge to the next rising edge of the first pulse signal becomes constant or shows no fluctuation at all.

Therefore, the effect of the jitter of the complementary data signal maybe removed from the signal level of the jitter measuring signal and the timing jitter in the data-signal-under-measurement may be measured accurately by passing the jitter measuring signal during when the first pulse signal indicates the logic value H and by holding and outputting the signal level of the jitter measuring signal during when the first pulse signal indicates the logic value L.

The sample-and-hold circuit 72 may also be an AD converter that receives the first pulse signal as a conversion triggering signal, converts the signal level of the jitter measuring signal to digital values and outputs them to the calculating section 74 corresponding to the conversion triggering signal.

Figure 6:
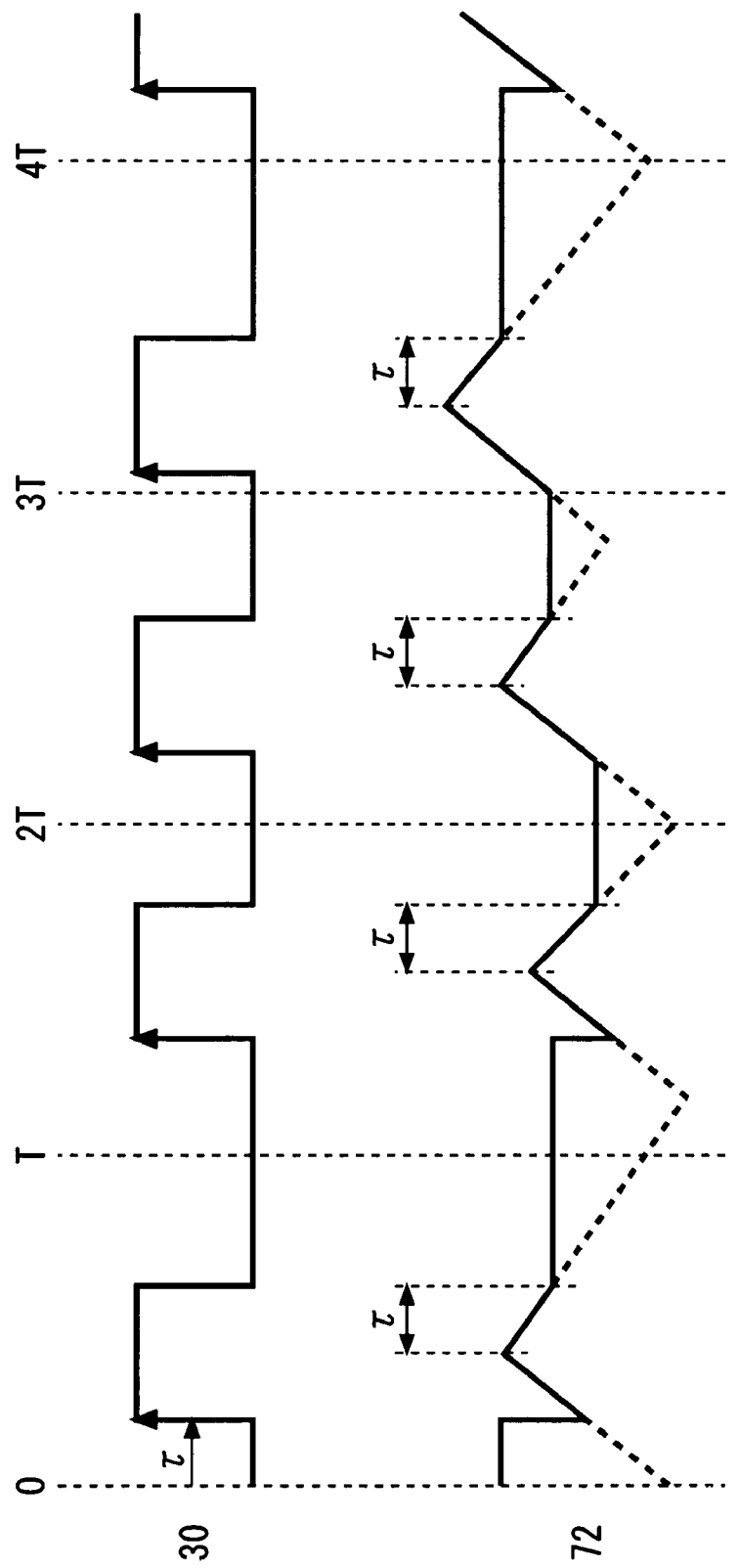
FIG. 6 is a chart showing another exemplary operation of the sample-and-hold circuit.

FIG. 6 is a chart showing another exemplary operation of the sample-and-hold circuit 72. While the sample-and-hold circuit 72 operates by receiving the first pulse signal and the jitter measuring signal, there is a case when an error occurs in the timing of giving the first pulse signal and the jitter measuring signal due to a propagation delay for example. For instance, when the timing of giving the first pulse signal delays by $\tau$ from the timing of giving the jitter measuring signal, the phase errors $\tau$ occur between the phase of the first pulse signal and the phase of the jitter measuring signal as shown in FIG. 6.

Even in such a case, the sample-and-hold circuit 72 passes the jitter measuring signal during when the first pulse signal indicates the logic value H and holds and outputs the signal level of the jitter measuring signal during when the first pulse signal indicates the logic value L. The signal level outputted from the sample-and-hold circuit 72 deviates from the peak levels of the ideal triangular wave of the jitter measuring signal in this case. However, since the signal level of the jitter measuring signal decreases at the constant rate of decrement, the signal level deviation is proportional to the phase error $\tau$. Accordingly, the difference between the signal level held by and outputted from the sample-and-hold circuit 72 and the reference value is proportional to the value of the timing jitter and exerts no influence on the linearity of the measurement.

The calculating section 74 can calculate the timing jitter accurately by multiplying a proportional coefficient corresponding to the phase error $\tau$ to the value of the calculated timing jitter.

The jitter measuring device 98 described above enables one to carry out the measuring operation of the regular time interval in measuring a clock signal having edges with a constant period or even in measuring a data-signal-under-measurement not having edges with such a constant period, as if it were the measurement of a signal having edges with a constant period. Then, extracting the component of the data-signal-under-measurement out of the measured result, the timing jitter in the data-signal-under-measurement can be measured accurately.

Figure 7:
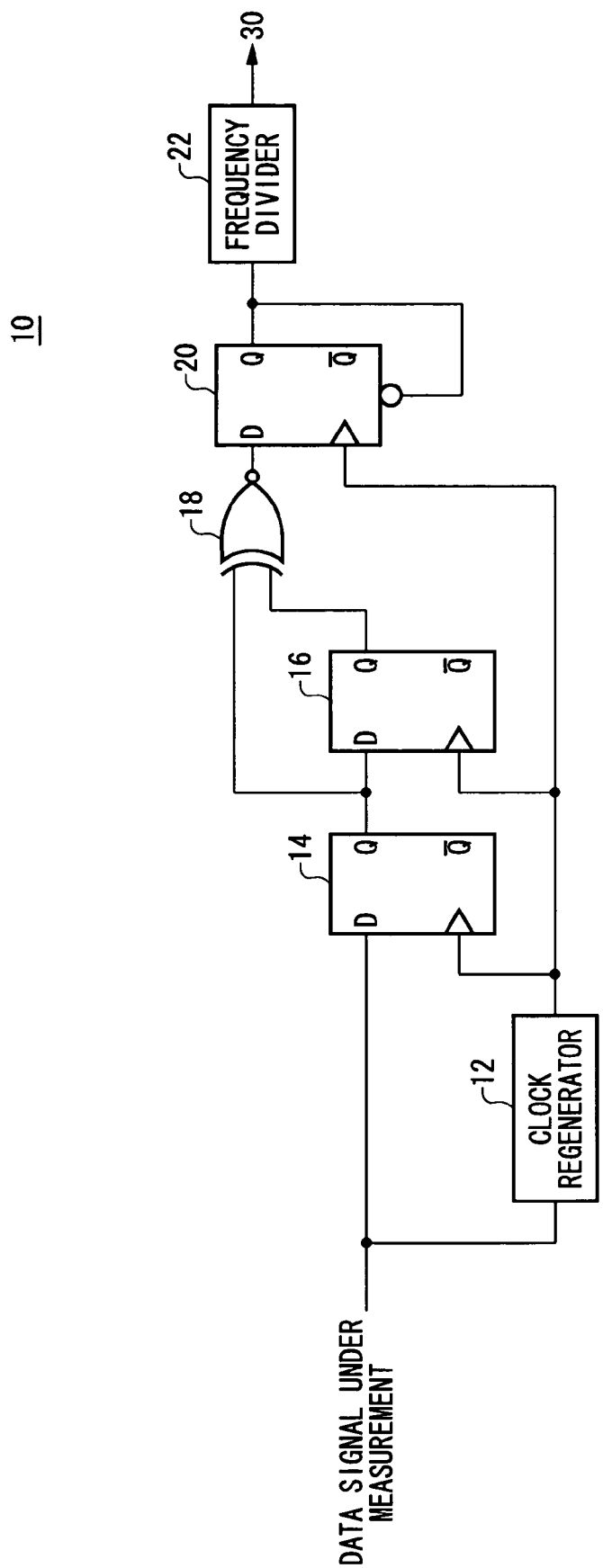
FIG. 7 is a diagram showing one exemplary configuration of the complementary data signal generating section.

FIG. 7 is a diagram showing one exemplary configuration of the complementary data signal generating section 10. The complementary data signal generating section 10 has a clock regenerator 12, a first D flip-flop 14, a second D flip-flop 16, a coincidence detector 18, a third D flip-flop 20 and a frequency divider 22.

Figure 8A:
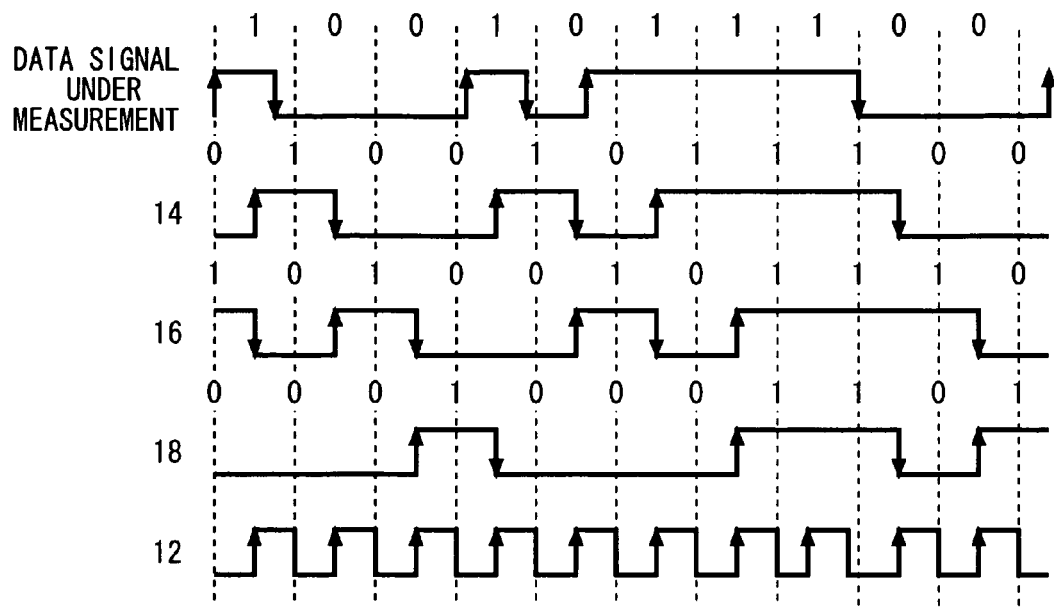
Figure 8B:
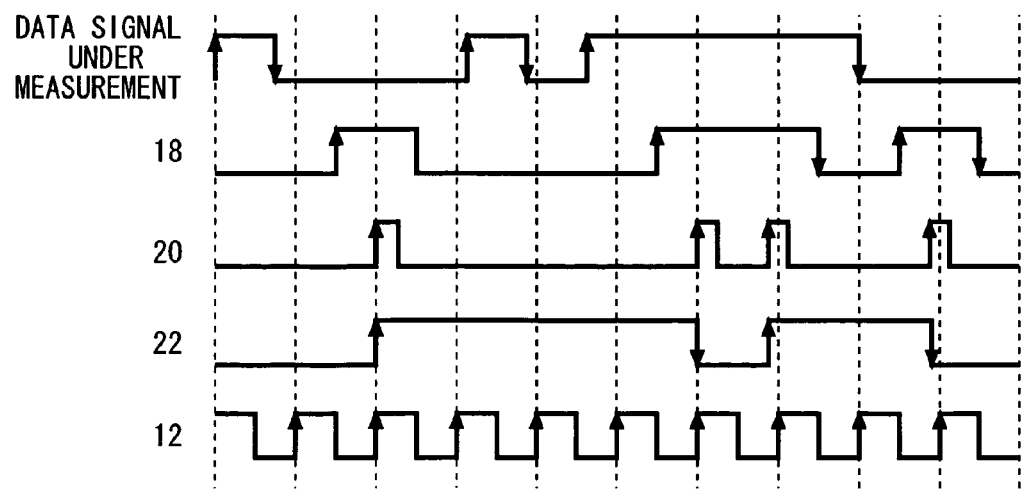

FIGS. 8A and 8B are timing charts for explaining one exemplary operation of the complementary data signal generating section 10, wherein FIG. 8A shows the operation from the clock regenerator 12 to the coincidence detector 18 and FIG. 8B shows the operation from the coincidence detector 18 to the frequency divider 22.

From the data-signal-under-measurement, the clock regenerator 12 generates a clock signal having an almost same period with the data section of the data-signal-under-measurement. The first D flip-flop 14 takes in and outputs the data-signal-under-measurement on the edge of clock signal.

The second D flip-flop 16 takes in and outputs the signal outputted from the first D flip-flop 14 on each edge of the clock signal. That is, the second D flip-flop 16 outputs the signal by delaying the inputted signal from the first D flip-flop 14 by one period of the data section of the data-signal-under-measurement.

The coincidence detector 18 outputs an coincident signal indicating logic H when the value of the signal outputted from the first D flip-flop 14 is equal to the value of the signal outputted from the second D flip-flop 16.

The third D flip-flop 20 takes in and outputs the signal outputted from the coincidence detector 18 on each edge of the clock signal. The internal data is reset by its own output signal. That is, when the third D flip-flop 20 receives the rising edge of the clock signal, it outputs a pulse having a very small pulse width which is shorter than the data section of the data-signal-under-measurement when the signal received from the coincidence detector 18 indicates the logic value H.

The frequency divider 22 divides the signal outputted from the third D flip-flop 20 by two to generate the complementary data signal. Here, 'divide by two' means to generate a signal whose logic value changes corresponding to either the rising edge or falling edge of the signal outputted from the third D flip-flop 20 as shown in FIG. 8B.

The complementary data signal of the data-signal-under-measurement can be generated readily by configuring as described above.

Figure 9:
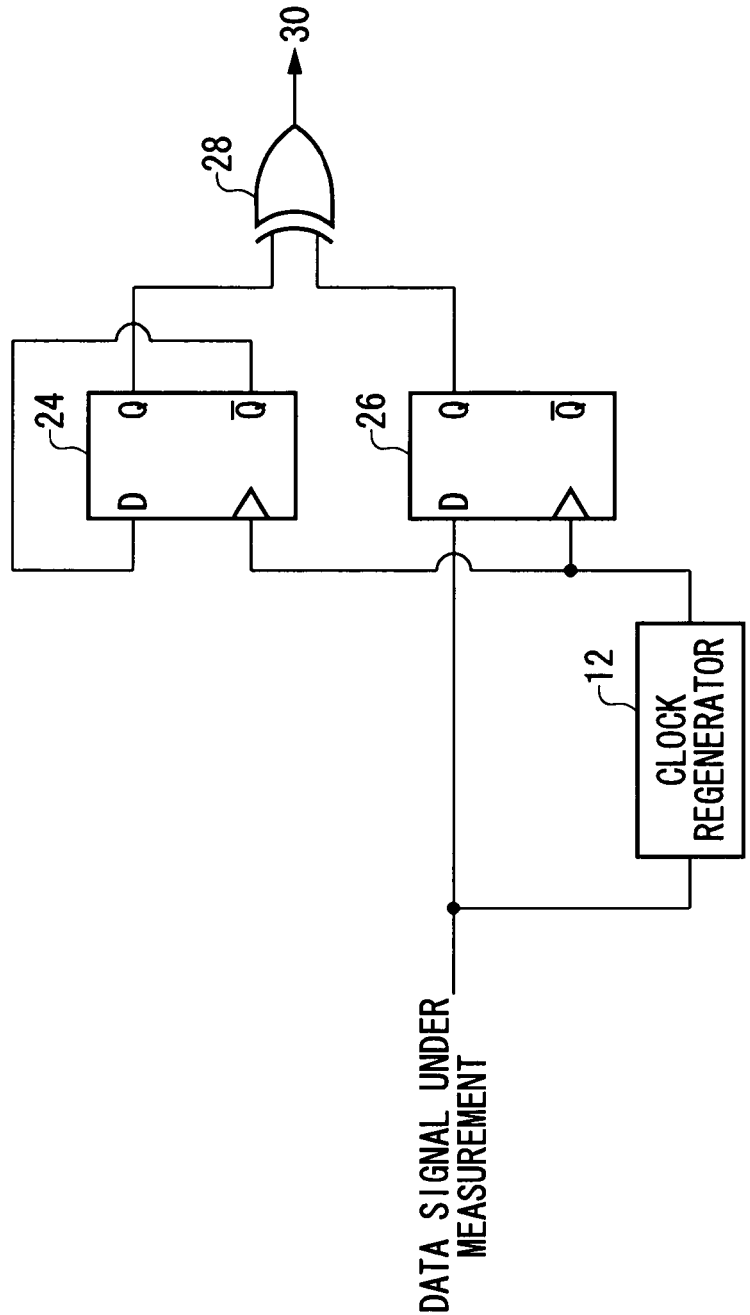
FIG. 9 is a diagram showing another exemplary configuration of the complementary data signal generating section.

FIG. 9 is a diagram showing another exemplary configuration of the complementary data signal generating section 10. The complementary data signal generating section 10 of this example has the clock regenerator 12, a fourth D flip-flop 24, a fifth D flip-flop 26 and an exclusive OR gate 28.

Figure 10:
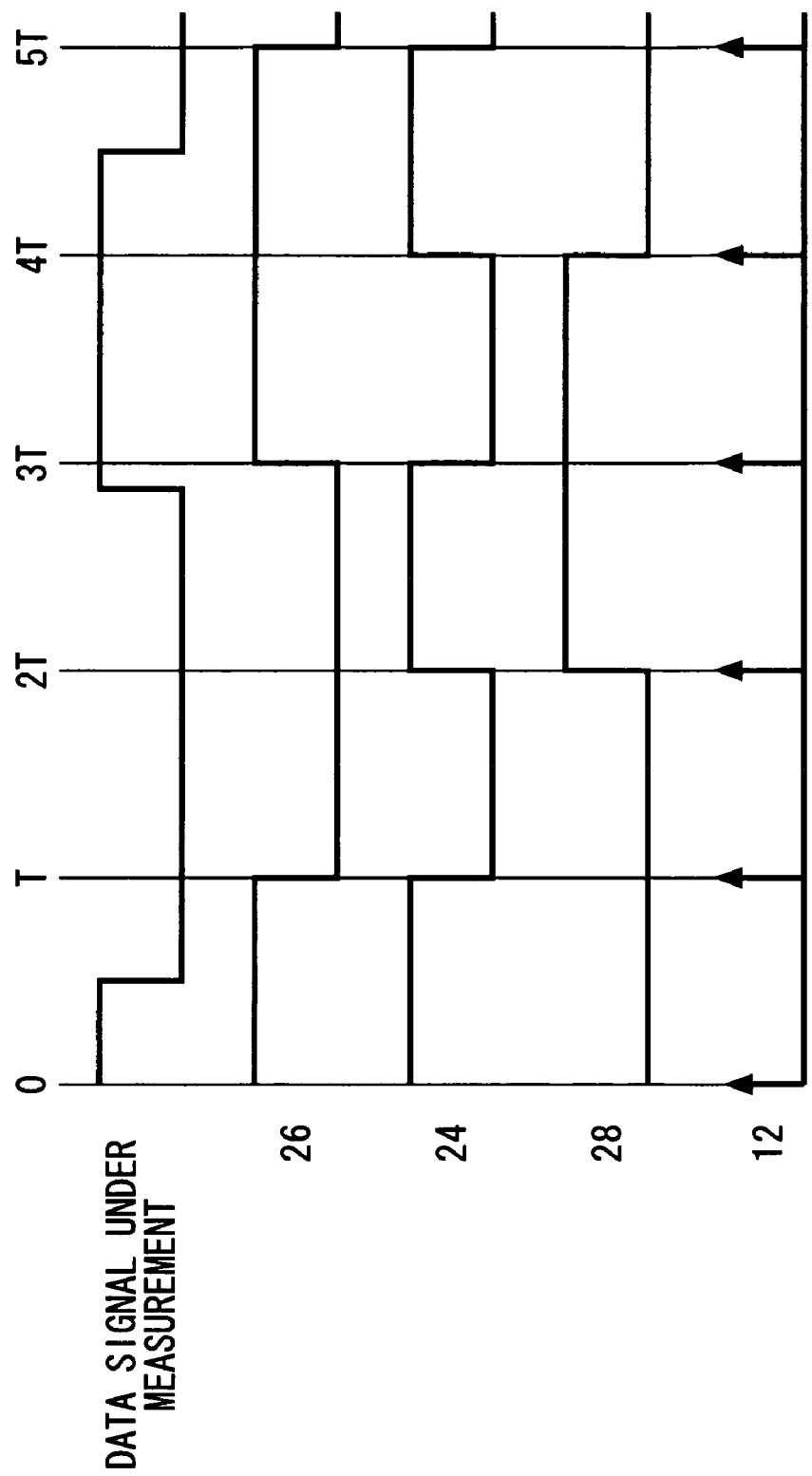
FIG. 10 is a timing chart showing one exemplary operation of the complementary data signal generating section shown in FIG. 9.

FIG. 10 is a timing chart showing one exemplary operation of the complementary data signal generating section 10 shown in FIG. 9. From the data-signal-under-measurement, the clock regenerator 12 generates the clock signal having the almost same period with the data section of the data-signal-under-measurement. The fifth D flip-flop 26 takes in and outputs the data-signal-under-with each clock signal. The clock signal is applied to a clock input terminal of the fourth D flip-flop 24 and an inverting output terminal and a data input terminal thereof are connected. That is, the fourth D flip-flop 24 generates a signal whose logic value is inverted on each edge of the clock signal.

The exclusive OR gate 28 outputs an exclusive OR of the signal outputted from the fourth D flip-flop 24 and the signal outputted from the fifth D flip-flop 26 as the complementary data signal.

The complementary data signal can be generated by the simple circuit structure as its configuration was illustrated above. Note that, although the initial value of the signal outputted from the fourth D flip-flop 24 at the time 0 has been assumed as the logic value H in FIG. 10, this configuration allows the complementary data signal being output with keeping the data transition timing even if the initial value is the logic value L. It only results in inverting the pattern of the signal outputted from the exclusive OR gate 28.

Figure 11:
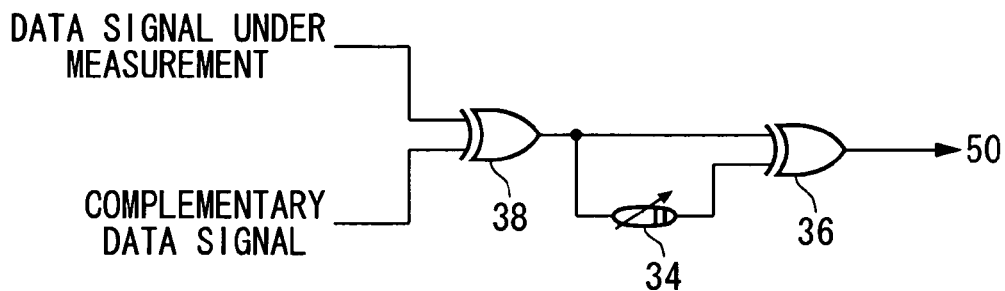
FIG. 11 is a diagram showing another exemplary configuration of the pulse generating section.

FIG. 11 is a diagram showing another exemplary configuration of the pulse generating section 30. Although the pulse generating section 30 in FIG. 1 has generated the pulse signals respectively for the data-signal-under-measurement and complementary data signal and has combined those pulse signals. After combining the data-signal-under-measurement and the complementary data signal, the generating section 30 of this example generates a pulse signal from the combined signals.

The pulse generating section 30 of this example has an exclusive OR gate 38, the delay circuit 34 and the exclusive OR gate 36. The delay circuit 34 and the exclusive OR gate 36 have the same function and configuration with the delay circuit 34 and the exclusive OR gate 36 explained in connection with FIG. 1.

Receiving the data-signal-under-measurement and the complementary data signal, the OR gate 38 outputs their exclusive OR. Because the logic value of the complementary data signal changes when the logic value of the data-signal-under-measurement does not change in the vicinity of the predetermined timing (0, T, 2T, etc.), the logic value of the signal outputted from the OR gate 38 is inverted in synchronism with the change of data in the both data-signal-under-measurement and complementary data signal. Therefore, timing jitter in the edges of the data-signal-under-measurement and complementary data signal are kept in the edge of the signal outputted from the OR gate 38.

Then, the same pulse signal with that of the pulse generating section 30 explained in connection with FIG. 1 can be generated by inputting the signal outputted from the OR gate 38 into the simple circuit, which consists of the delay circuit 34 and the exclusive OR gate 36.

Still more, the pulse generating section 30 of this example can generate the pulse signal corresponding to the edges of the both data-signal-under-measurement and complementary data signal by using a single delay circuit 34. Therefore, it permits one to ignore processing variations in the semiconductor manufacturing process and to make the pulse width of the pulse signal be constant.

Figure 12:
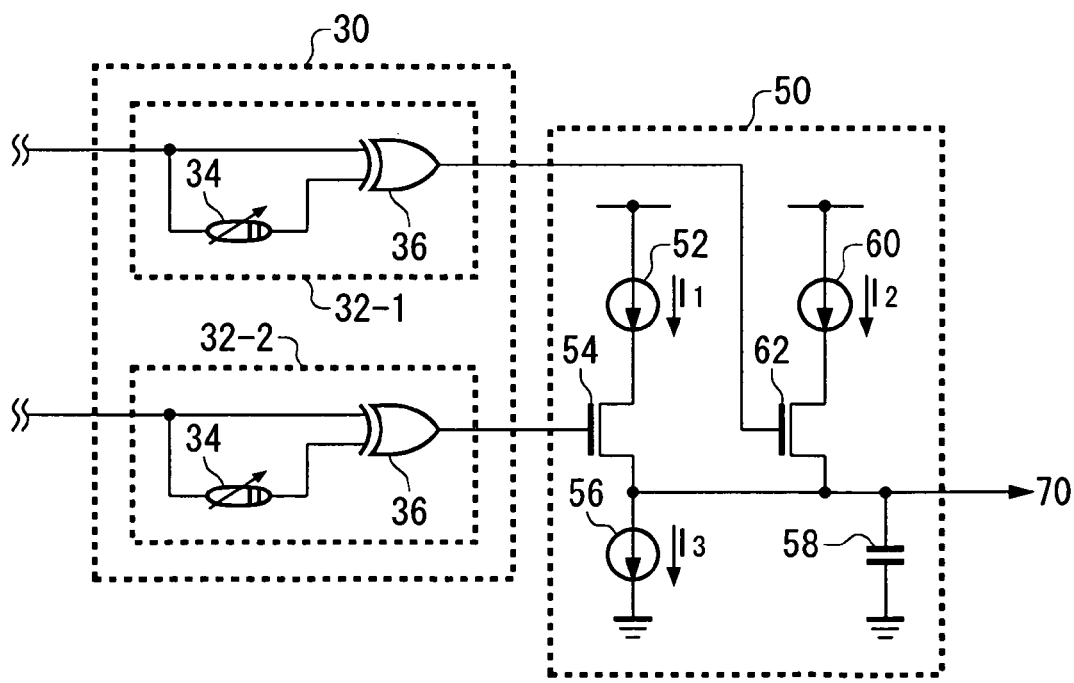
FIG. 12 is a diagram showing another exemplary configuration of the pulse generating section and the integrator section.

FIG. 12 is a diagram showing another exemplary configuration of the pulse generating section 30 and the integrator section 50. The pulse generating section 30 of this example is different from the configuration of the pulse generating section 30 explained in connection with FIG. 1 in that it has no OR gate 38. That is, the pulse generating section 30 of this example supplies the first pulse signal outputted from the first pulse generator 32-1 and the second pulse signal outputted from the second pulse generator 32-2 to the integrator section 50.

The integrator section 50 has a first current source 52, a first charge/discharge control section 54, a current sink 56, a second current source 60, a second charge/discharge control section 62 and a capacitor 58. The first current source 52 generates a first source current specifying a rate of increment of signal level of a triangular wave corresponding to a pulse of a second pulse signal among the respective triangular waves of the jitter measuring signal. The second current source 60 generates a second source current specifying a rate of increment of signal level of a triangular wave corresponding to a pulse of a first pulse signal among the respective triangular waves of the jitter measuring signal.

The first current source 52 is connected with the capacitor 58 via the first charge/discharge control section 54. The second current source 60 is connected with the capacitor 58 via the second charge/discharge control section 62.

The capacitor 58 generates voltage level of the jitter measuring signal by being charged by the first current source 52 or the second current source 60 and by being discharged by the current sink 56.

Still more, the first charge/discharge control section 54 makes the difference between the first source current and the sink current charge up the capacitor 58 during when the second pulse signal indicates the logic value H and makes the sink current discharge the capacitor 58 during when the second pulse signal indicates the logic value L.

The second charge/discharge control section 62 makes the difference between the second source current and the sink current charge up the capacitor 58 during when the first pulse signal indicates the logic value H and makes the sink current discharge the capacitor 58 during when the first pulse signal indicates the logic value L.

That is, by controlling the first and second source currents, the integrator section 50 of this can control the rate of increment of the triangular wave corresponding to the first pulse signal and the rate of increment of the triangular wave corresponding to the second pulse signal independently. It is noted that the rate of decrement of the triangular wave of each are equal because the same sink current is used.

Such configuration enables one to control the source current in order that the signal levels of the extreme values in the jitter measuring signal become a predetermined value, even if a delay error is associated with the respective delay circuits 34, by compensating the associated delay error. Still more, even if the delay errors in the respective delay circuits 34 vary, this configuration can eliminate such variation.

Still more, as explained in connection with FIG. 5, when the jitter calculating section 70 has the sample-and-hold circuit 72, it is preferable to make the difference in the signal levels of the jitter measuring signal be constant over the time interval from the falling edge to the next rising edge of the first pulse signal even if the position of the second pulse signal fluctuates between the pulses of the first pulse signal. Because, for the respective triangular waves of the jitter measuring signal in the integrator section 50 of this example, the rate of decrement is also a constant value, the difference in the signal levels of the jitter measuring signal becomes constant over the time interval from the falling edge to the next rising edge of the first pulse signal is fixed even if the position of the pulse of the second pulse signal fluctuates between the pulses of the first pulse signal.

Figure 13:
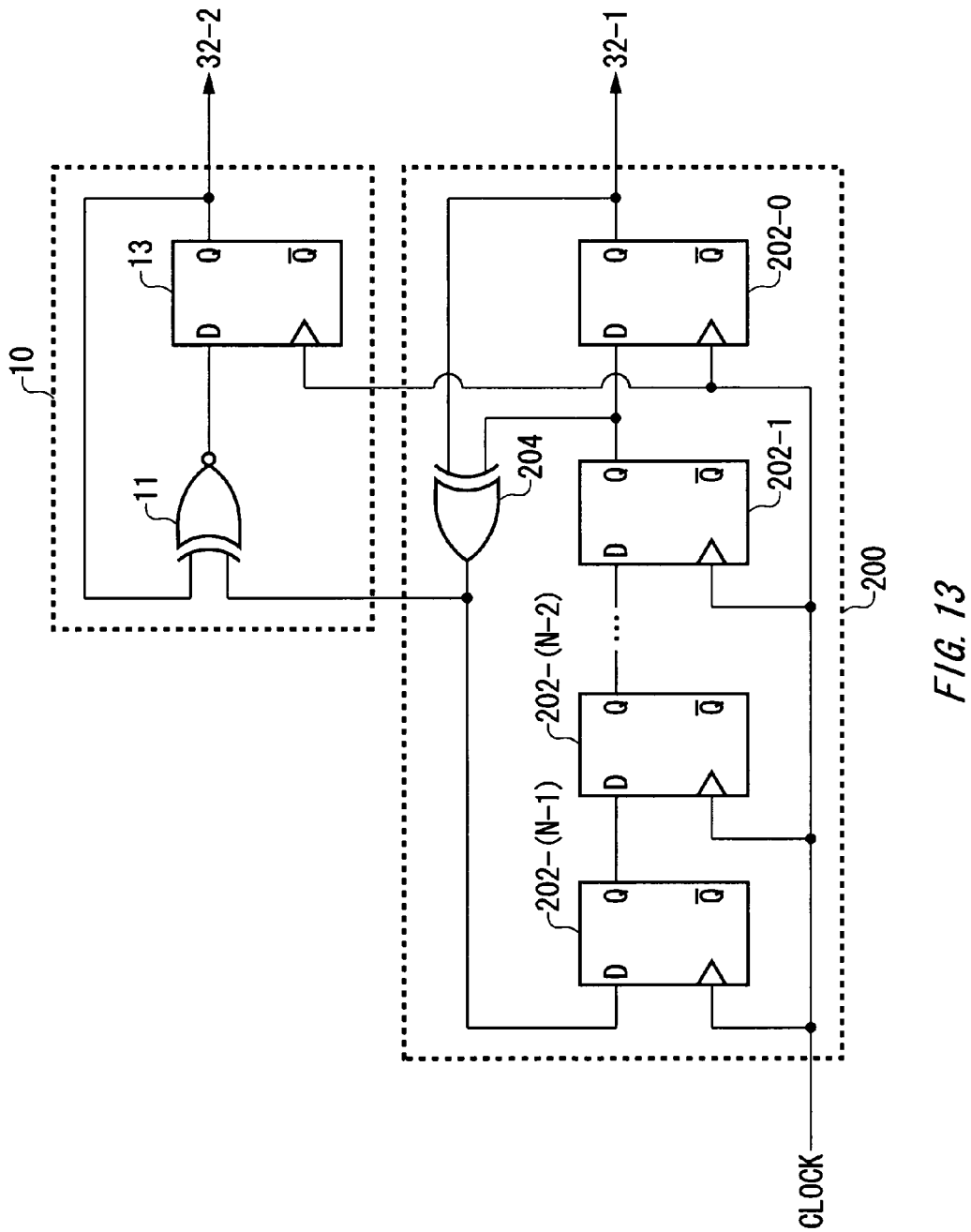
FIG. 13 is a diagram showing another exemplary configuration of the complementary data signal generating section.

FIG. 13 is a diagram showing another exemplary configuration of the complementary data signal generating section 10. In this example, the jitter measuring device 98 receives a pseudo random pattern signal outputted from a device-under-test 200 as a data-signal-under-measurement.

Figure 14:
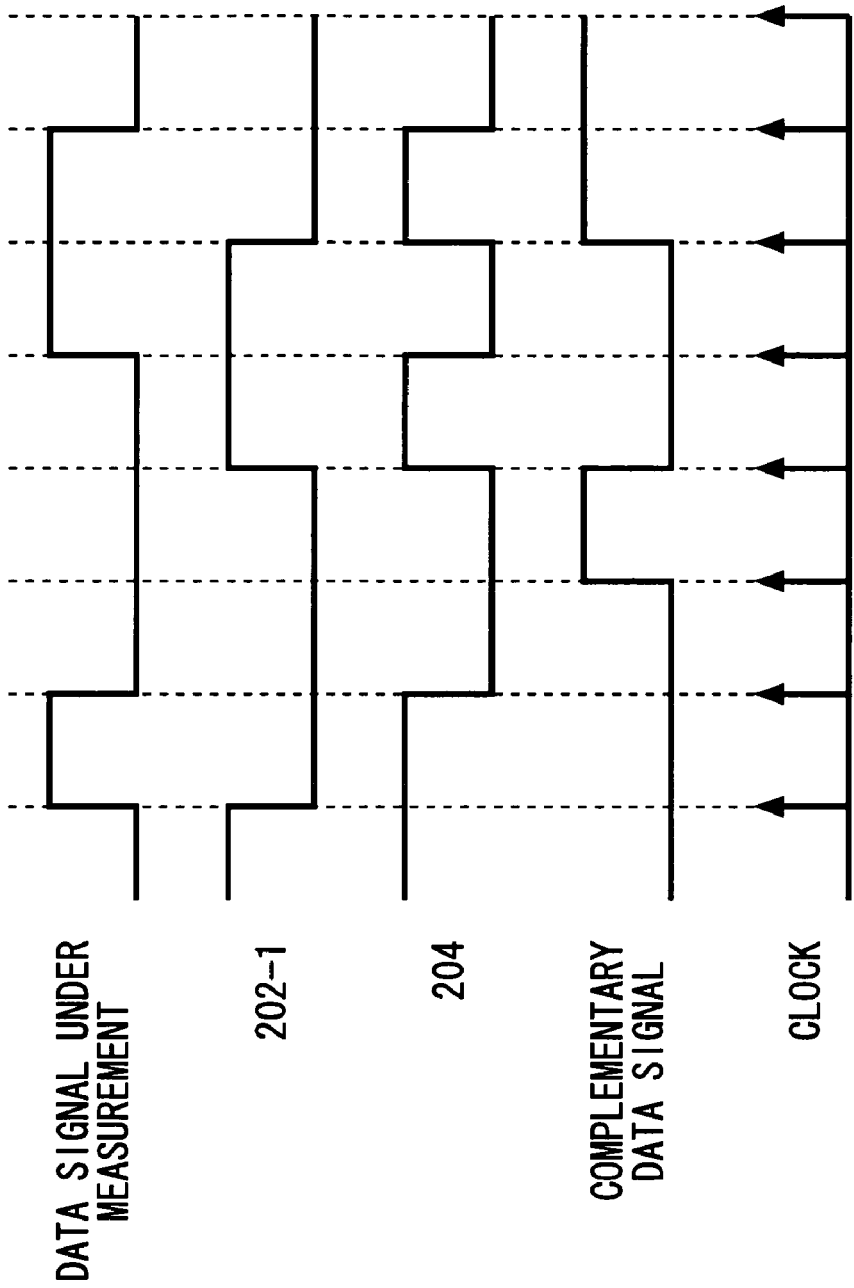
FIG. 14 is a timing chart showing one exemplary operation of the third D flip-flop and the complementary data signal generating section shown in FIG. 13.

FIG. 14 is a timing chart showing one exemplary operation of the device-under-test 200 and the complementary data signal generating section 10 shown in FIG. 13.

The device-under-test 200 consists of a chain of N D-flip-flops (202-0 through 202-(N-1), referred to as 202 in general hereinafter) in cascade and an exclusive OR gate 204. Each of the D input of the D flip-flops 202 receives a signal outputted from the positive Q output terminal of the connected D-flip-flop 202 on the edge of the common clock. The exclusive OR gate 204 outputs an exclusive OR of a signal outputted from the right-most D flip-flop 202-0 and a signal outputted from its preceding D flip-flop 202-1. A signal outputted from the exclusive OR gate 204 is inputted to the left-most D flip-flop 202-(N-1). That is, the exclusive OR gate 204 inputs a logic value 0 to the left-most D flip-flop 202-(N-1) when the adjacent logic values in the signal outputted from the right-most D flip-flop 202-0 are identical. It inputs a logic value 1 to the left-most D flip-flop 202-(N-1) when the receiving adjacent logic values are different from each other. Through such configuration, the right-most D flip-flop 202-0 outputs the pseudo random pattern signal as the data-signal-under-measurement.

The pseudo random pattern signal generated from the N D flip-flops 202 will be referred to as N-bit pseudo random pattern sequence hereinafter. The N-bit pseudo random pattern sequence is a signal wherein a number of data in a single pattern cycle is $(2^N)-1$ and which goes through all $(2^N)-1$ before repeating. A number of transitions between data values that N-bit pseudo random pattern sequence makes in a single pattern cycle is determined by $2^{(N-1)}$ in the N-bit pseudo random pattern sequence. For example, in a pseudo random pattern sequence of three bits, a number of data in a single pattern cycle is 7 and a number of transitions between the data values in a single pattern cycle is four. FIG. 14 illustrates a case when the device-under-test 200 generates the three-bit pseudo random pattern sequence and when data in a single pattern cycle of the pseudo random pattern sequence is 0100011. Because the exclusive OR gate 204 outputs the logic value 0 when the adjacent logic values in the pseudo random pattern sequence are identical. Otherwise it outputs the logic value 1. Thus the resultant pattern turns out to be 1100101.

The complementary data signal generating section 10 of this example has an coincidence detector 11 and a D flip-flop 13. The coincidence detector 11 is a circuit that outputs a logic value H when the signal outputted from the exclusive OR gate 204 of the device-under-test 200 is equal to the signal outputted from the positive output Q terminal of the D flip-flop 13. The coincidence detector 11 may be a so-called exclusive NOR.

The D flip-flop 13 takes in and outputs the signal outputted from the coincidence detector 11 on the edge of the clock given to the device-under-test 200. Because the coincidence detector 11 inverts the signal outputted from the D flip-flop 13 and inputs it to the D flip-flop 13 when the adjacent logic values in the pseudo random pattern sequence are identical, the signal outputted from the D flip-flop 13 has transition edges at timing where the logic value of the pseudo random pattern sequence does not change its value. In the example shown in FIG. 14, the pattern of the complementary data signal becomes 0001001.

Such configuration allows the complementary data signal of the pseudo random pattern sequence to be readily generated. It also has a merit that the complementary data signal is already synchronized with the pseudo random pattern sequence.

Figure 15:
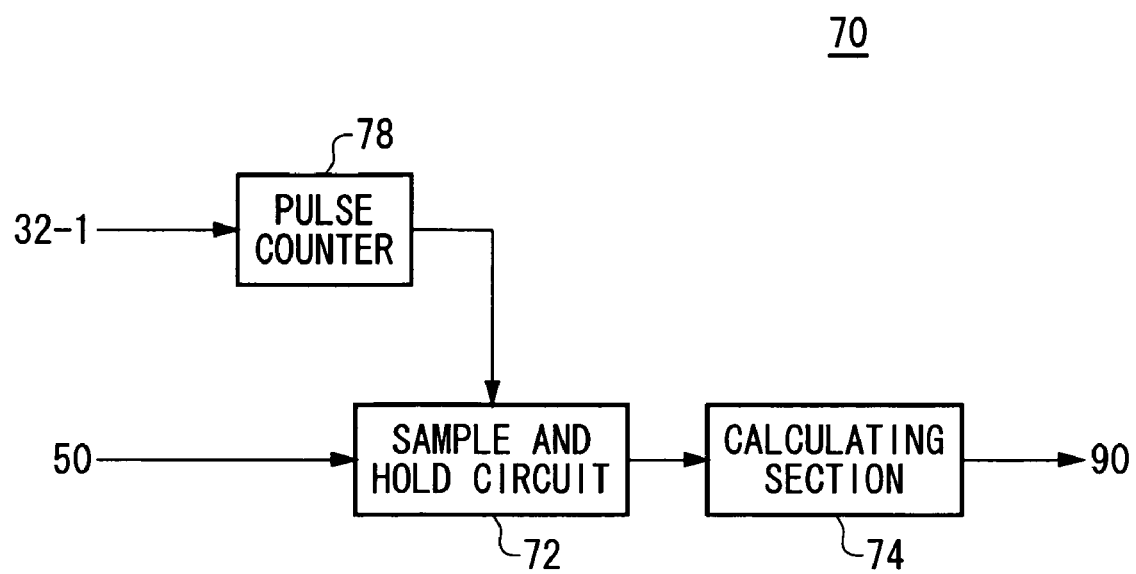
FIG. 15 is a diagram showing another exemplary configuration of the jitter calculating section.

FIG. 15 is a diagram showing another exemplary configuration of the jitter calculating section 70. In this example, for signal such as a pseudo random pattern sequence which repeats the same data pattern cycle, the jitter measuring device 98 measures jitters on each data transition edge, whose occurrence in a single pattern cycle is pre-determined. It enables one to remove the influence of deterministic jitter, which is dependent on the data pattern, and to measure random jitter accurately. The 'pattern period' is a period wherein the same data pattern is repeated. In case of the three-bit pseudo random pattern sequence for example, one single pattern cycle is formed by seven data, so that the pattern period becomes seven data.

The pulse generating section 30 has the first pulse generator 32-1 and the second pulse generator 32-2 as explained in connection with FIG. 1 or 12.

In addition to the configuration of the jitter calculating section 70 shown in FIG. 4, the jitter calculating section 70 of this example has a pulse counter 78. The pulse counter 78 counts a number of pulses in the first pulse signal in each pattern cycle period of the data-signal-under-measurement. That is, the pulse counter 78 counts each pulse to identify the unique edge in each pattern cycle period with number of associated pulse. Then, immediately after counting pulses over one pattern cycle period, the count value is reset and it begins to count pulses to find the next targeted edge in the next pattern cycle period. Then, when the count value becomes a value set in advance that specifies the order of the edge where jitter is to be measured in each pattern period, the pulse counter 78 outputs the pulse. A pulse width of the pulse may be almost equal to the pulse width of the pulse signal outputted from the pulse generating section 30. Still more, the pulse counter 78 may be configured so as to pass the pulses of the first pulse signal when the count value becomes the value set in advance.

The sample-and-hold circuit 72 passes the jitter measuring signal during when the signal received from the pulse counter 78 indicates the logic value H and holds the signal level of the jitter measuring signal and supplies it to the calculating section 74 during when the signal does not indicate the logic value H.

Jitter in the data transition edge of the order set in advance in each pattern period may be measured and the random jitter may be measured through such operations.

Figure 16:
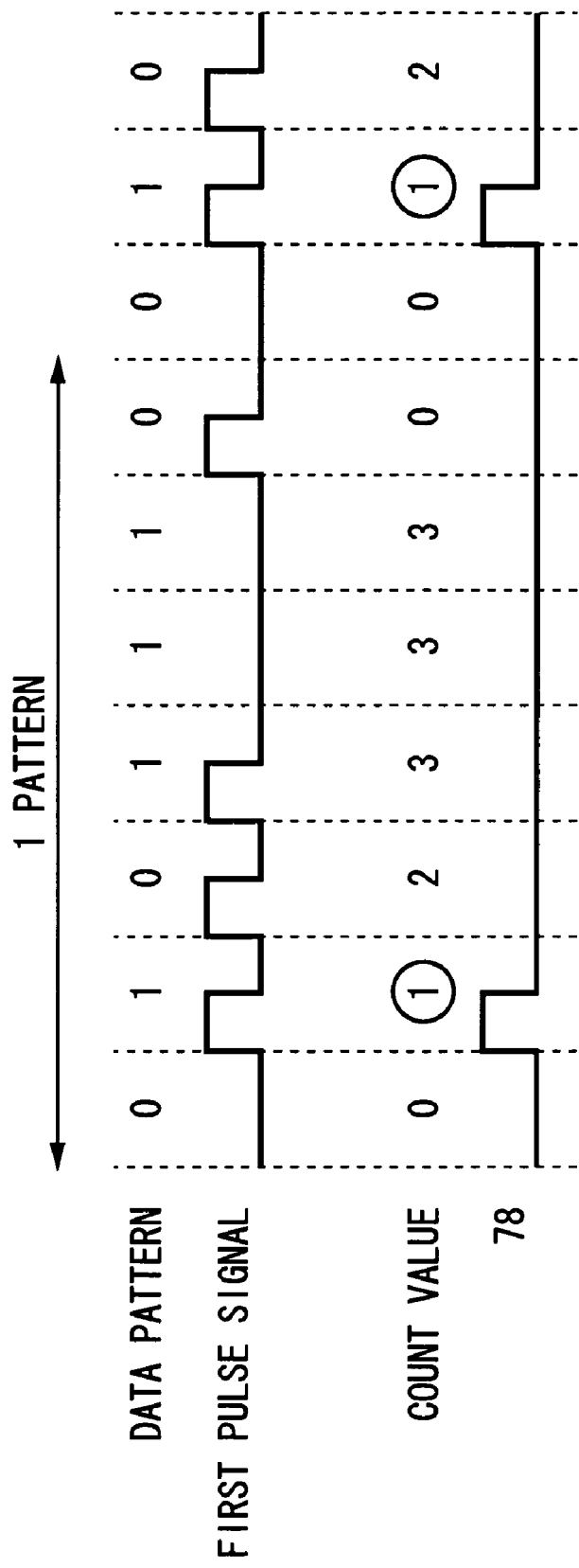
FIG. 16 is a timing chart showing one exemplary operation of a pulse counter shown in FIG. 15.

FIG. 16 is a timing chart showing one exemplary operation of the pulse counter 78 explained in FIG. 15. In this example, the data-signal-under-measurement is assumed to the three-bit pseudo random pattern sequence and has a single pattern cycle of data value of 0101110. Because the number of transitions in one single pattern cycle is four in this case, a number of pulses in the first pulse signal over one single pattern cycle is four. In this case, the pulse counter 78 resets the count value when the count value becomes four. Still more, the pulse counter 78 outputs the pulse when the count value is 1 in this example. In advance, the user may set the count value of the pulse counter 78 in order to reset the counter at this particular edge and select the count value for outputting pulse.

The pulse counter 78 counts pulses in the first pulse signal over each pattern cycle as described above. Then, it outputs the pulse when the count value becomes 1.

Figure 17:
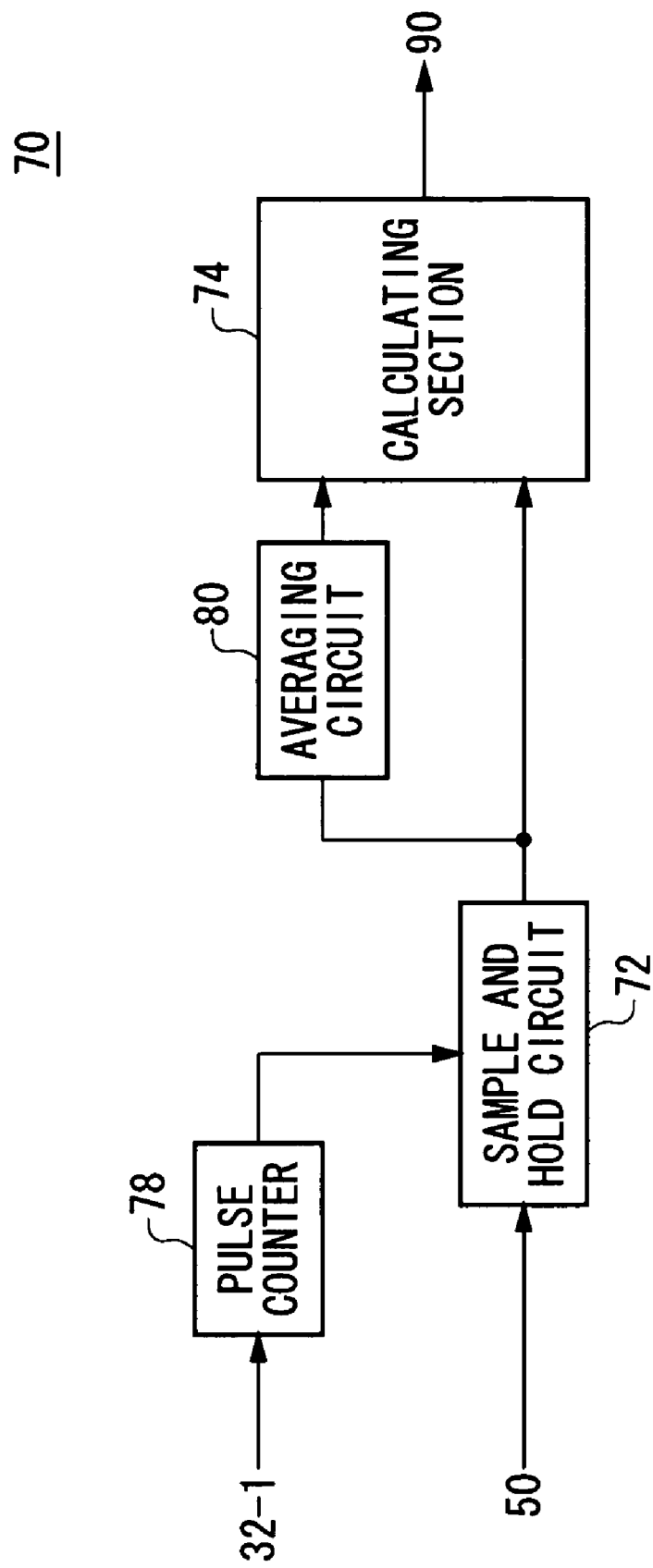
FIG. 17 is a diagram showing another configuration of the jitter calculating section.

FIG. 17 is a diagram showing another configuration of the jitter calculating section 70. In this example, the jitter calculating section 70 measures deterministic jitter, random jitter and total jitter in the data-signal-under-measurement. In addition to the configuration of the jitter calculating section 70 explained in FIG. 15, the jitter calculating section 70 of this example has an averaging circuit 80.

In measuring the deterministic jitter, the pulse counter 78 sequentially changes the setting of the count value for outputting pulse. For instance, it sequentially increases the setting of the count value to measure associated jitter for all the count values when the first pulse signal is provided over the predetermined pattern cycle. Corresponding to the value set by the pulse counter 78, the sample-and-hold circuit 72 sequentially changes the order number of the pulse, in the first pulse signal, for making the jitter measuring signal pass the circuit.

For each selected value of the pulse counter 78, the averaging circuit 80 calculates an average value of the voltage level in the jitter measuring signal outputted from the sample-and-hold circuit 72. The averaging circuit 80 may be a filter that removes high-frequency components set in advance from the jitter measuring signal outputted out of the integrator section 50.

The calculating section 74 calculates timing jitter of the selected pulse in the first pulse signal, i.e., for each selected value of the pulse counter 78, and calculates deterministic jitter values in the data-signal-under-measurement from the calculated timing jitter values. The deterministic jitter may be calculated from the variance of timing jitters associated with each selected value of the pulse counter 78.

In measuring the random jitter, the jitter calculating section 70 functions as explained in connection with FIG. 5. In this case, the averaging circuit 80 is selected not to work.

In measuring the total jitter, the jitter calculating section 70 works as explained in connection with FIG. 4. In this case, the pulse counter 78 passes the first pulse signal to supply it to the sample-and-hold circuit 72. The averaging circuit 80 is selected not to work either in this case.

Such configuration allows the deterministic jitter, random jitter and total jitter to be readily measured.

Figure 18:
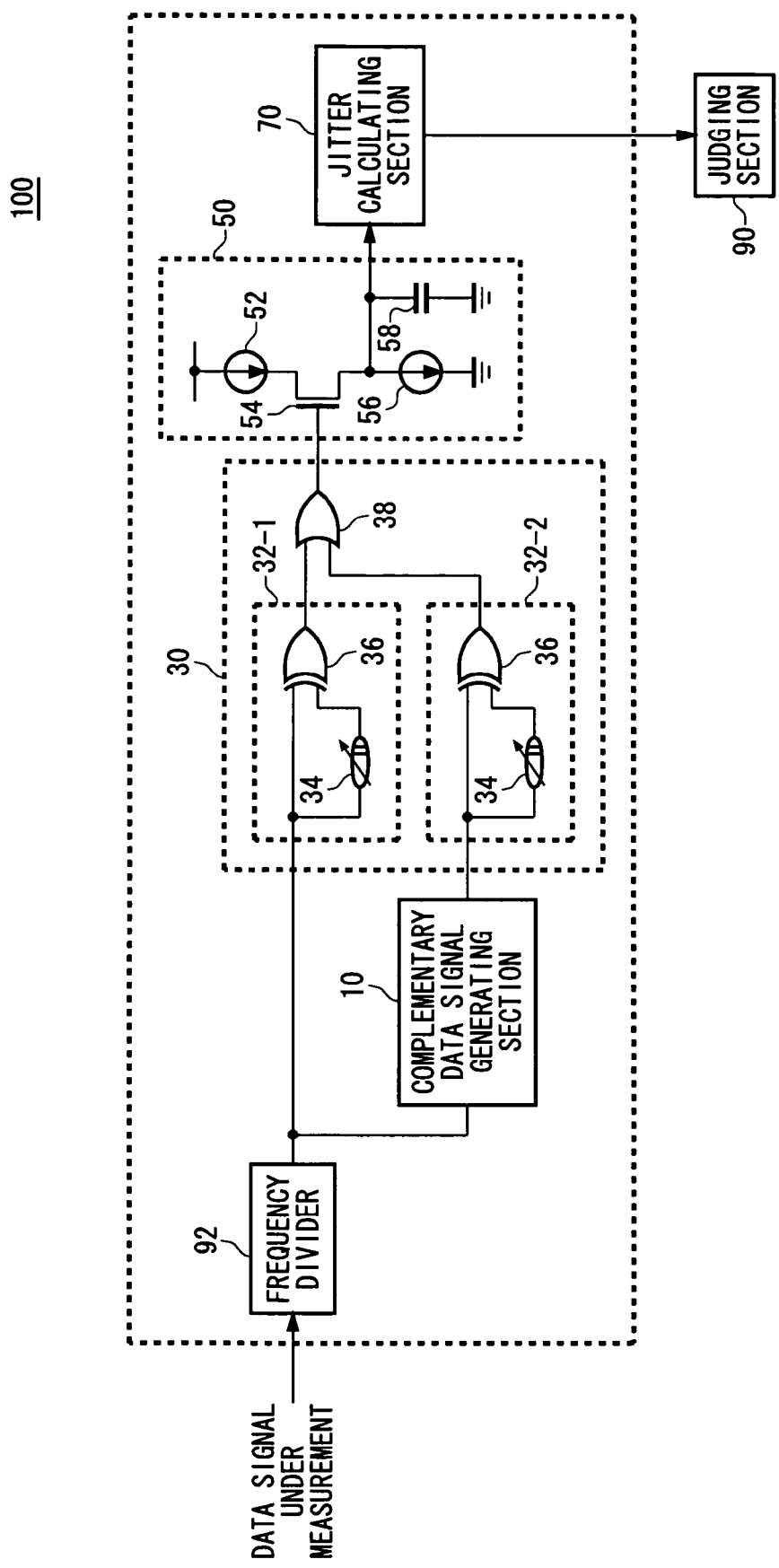
FIG. 18 is a diagram showing another configuration of the jitter measuring device.

FIG. 18 is a diagram showing another configuration of the jitter measuring device 98. The jitter measuring device 98 of this example has a frequency divider 92 in addition to the configuration of the jitter measuring device 98 explained in connection with FIG. 1. Here, the data-signal-under-measurement is a signal that repeats the same data pattern periodically with the period of a pattern set in advance.

The frequency divider 92 divides the data-signal-under-measurement corresponding to the number of data transitions in each pattern cycle of the data-signal-under-measurement. If the number of data transitions in each pattern cycle of the data-signal-under-measurement is k for example, the frequency divider 92 divides the data-signal-under-measurement by (k+1). The complementary data signal generating section 10 generates a complementary data signal of the divided data-signal-under-measurement.

Figure 19:
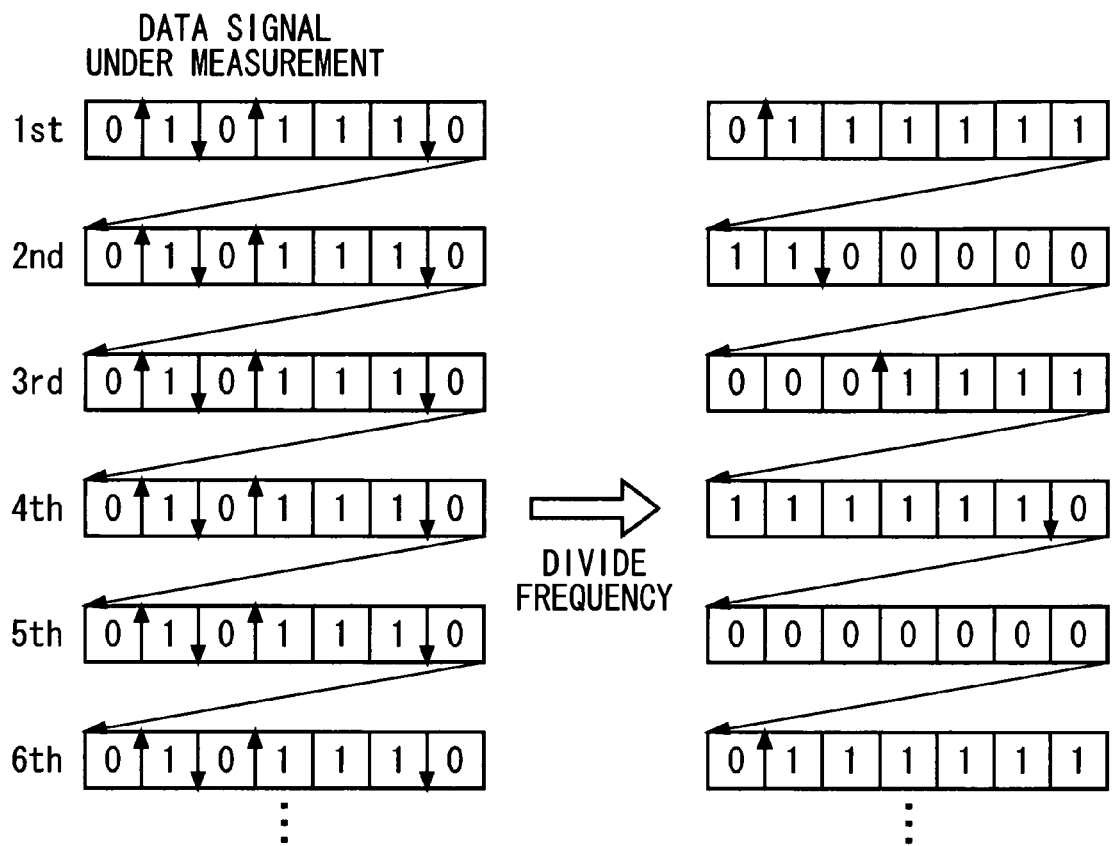
FIG. 19 is a chart showing one exemplary operation of a frequency divider.

FIG. 19 is a chart showing one exemplary operation of the frequency divider 92. Here, the data-signal-under-measurement is a three-bit pseudo random pattern sequence and a logic value in one pattern cycle is 0101110.

In this case, because the number of times of data transition is four, the frequency divider 92 divides the data-signal-under-measurement by five. Here, 'divide' means to change data at timing corresponding to an m-th data transition edge in a m-th pattern cycle in the data-signal-under-measurement. In this example, the first data transition edge in the first pattern cycle in the data-signal-under-measurement is a boundary between the first data bit and the second data bit in the pattern cycle, so that the data changes at the boundary between the first data bit and the second data bit of the corresponding pattern cycle in the signal and the divided data does not change at the other timings in the pattern cycle. That is, the frequency divider 92 keeps that transition edge of the data-signal-under-measurement and makes the other edges hold the data value of that edge.

For other pattern cycles, similar process is carried out to obtain the divided pattern signal as shown in FIG. 19. The divided pattern signal becomes a signal that repeats the same pattern with a period of 5T, where T is the pattern period of the data-signal-under-measurement. And each data transition edge keeps timing jitter of the corresponding edge of the data-signal-under-measurement.

Therefore, even when a bit interval of the data-signal-under-measurement is narrow and no operative time interval necessary for the sample-and-hold circuit 72 and others cannot be assured, the sample-and-hold circuit 72 and others may be operated normally by performing frequency division on the data-signal-under-measurement. Still more, because the divided signal pattern keeps timing jitter in the data-signal-under-measurement, the timing jitter may be measured accurately.

As explained in connection with FIGS. 1 through 19, the pulse generating section 30 may generate the pulse signal responding to the change in either or both of the rising edge and falling edge of the data-signal-under-measurement and the complementary data signal. For instance, in order to measure timing jitter of the rising edge of the data-signal-under-measurement, the pulse signal may be generated corresponding to the rising edge of the data-signal-under-measurement and complementary data signal.

Figure 20:
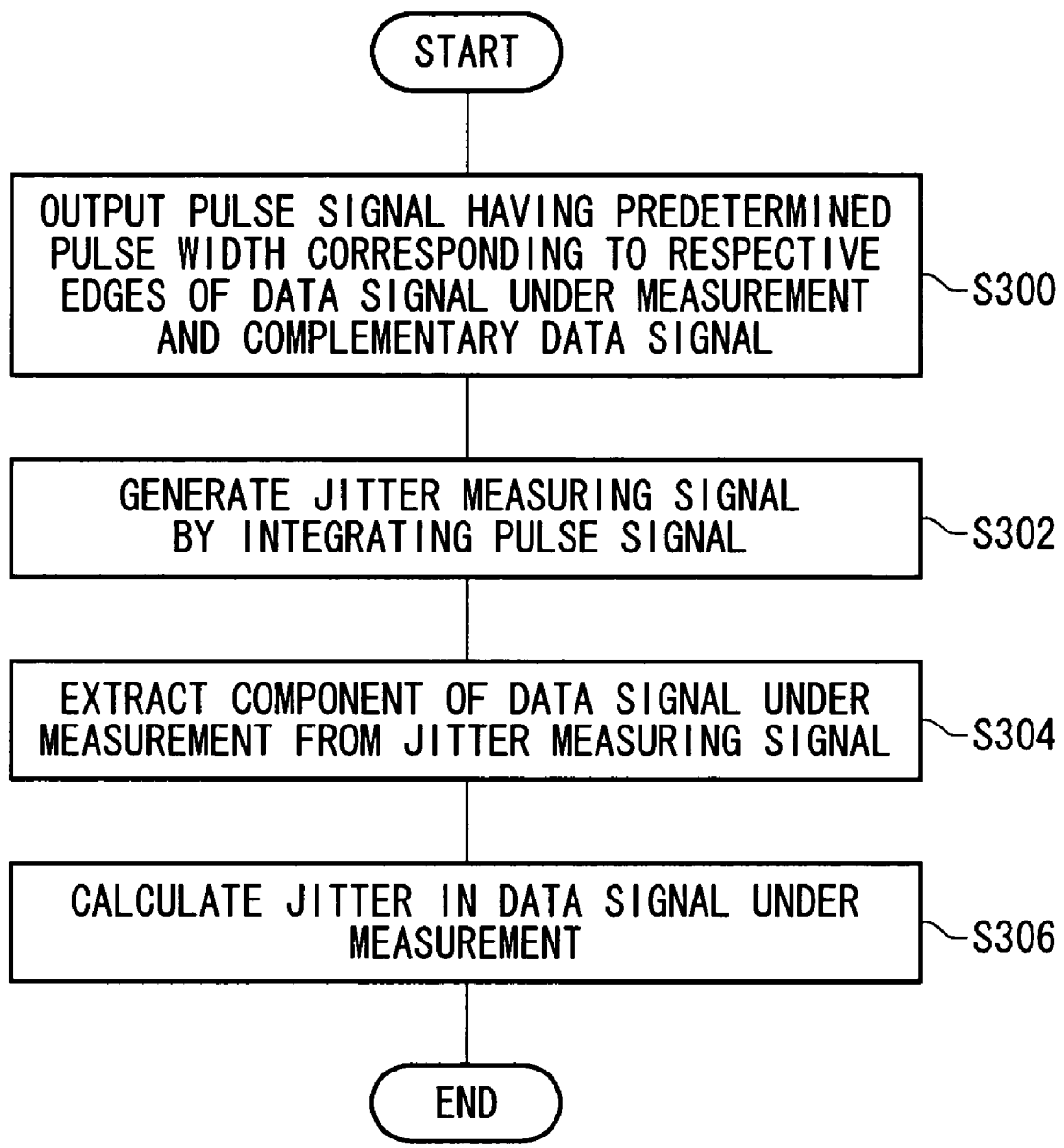
FIG. 20 is a flowchart showing one exemplary method for measuring timing jitter in a data-signal-under-measurement.

FIG. 20 is a flowchart showing one exemplary method for measuring timing jitter in a data-signal-under-measurement. In this measuring method, timing jitter is measured by using the jitter measuring device 98 explained in FIGS. 1 through 19. At first, the pulse generating section 30 outputs the pulse signal having a predetermined pulse width corresponding to the respective edges of the data-signal-under-measurement and the complementary data signal in Step S300.

Here, the complementary data signal may be generated by the complementary data signal generating section 10 explained in FIG. 1.

Next, the integrator section 50 generates the jitter measuring signal by integrating the pulse signal in Step S302. Then, the jitter calculating section 70 extracts the component corresponding to the data-signal-under-measurement from the jitter measuring signal in Step S304. For instance, as explained in connection with FIG. 4, the component corresponding to the data-signal-under-measurement is extracted by using the sample-and-hold circuit 72. When the complementary data signal is almost jitter-free, the process in Step S304 needs not be carried out. Then, based on the extracted jitter measuring signal, the jitter calculating section 70 calculates jitter in the data-signal-under-measurement in Step S306. It may calculate the timing jitter based on the difference between each extreme value of the jitter measuring signal and a signal level set in advance. This difference is proportional to amplitude of the timing jitter.

Figure 21:
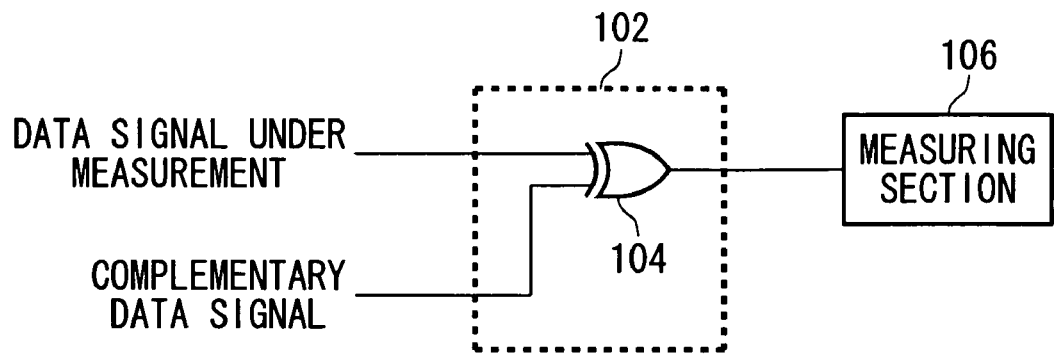
FIG. 21 is a diagram showing another exemplary configuration of the test apparatus.

FIG. 21 is a diagram showing another exemplary configuration of the test apparatus 100. The test apparatus 100 of this example receives the complementary data signal of the data-signal-under-measurement from the outside. For instance, the complementary data signal may be given from an external testing apparatus. The complementary data signal may be also generated from the data-signal-under-measurement by using means having the equivalent function with that of the complementary data signal generating section 10 explained in FIG. 1 and may provide it to the test apparatus 100.

The test apparatus 100 has an input section 102 and a measuring section 106. The measuring section 106 is a device capable of measuring timing jitter of a clock signal having pulses of almost same period. For example, the measuring section 106 may be an oscilloscope, a spectrum analyzer, a clock jitter measuring circuit or the like.

The input section 102 receives the data-signal-under-measurement and the complementary data signal and inputs them to the measuring section 106 by synchronizing the data-signal-under-measurement and the complementary data signal.

In this example, the input section 102 has a logical circuit 104 that outputs an exclusive OR of the data-signal-under-measurement and the complementary data signal.

The measuring section 106 measures timing jitter based on the edges of the both data-signal-under-measurement and complementary data signal. At this time, the measuring section 106 may extract the jitter component in the data-signal-under-measurement from the measured timing jitter as explained in FIG. 5. When the complementary data signal is almost jitter-free, the timing jitter measured by the measuring section 106 becomes almost equivalent to the timing jitter in the data-signal-under-measurement.

That is, the test apparatus 100 of this example inputs the complementary data signal in synchronism with the data-signal-under-measurement to the measuring device capable of measuring the jitter in the clock signal having a constant period. Thereby, the measuring device for clock signal may accurately measure jitter in the data-signal-under-measurement having a random pattern.

The measuring section 106 may be a device having the pulse generating section 30, the integrator section 50 and the jitter calculating section 70 explained in FIGS. 1 through 20.

Figure 22:
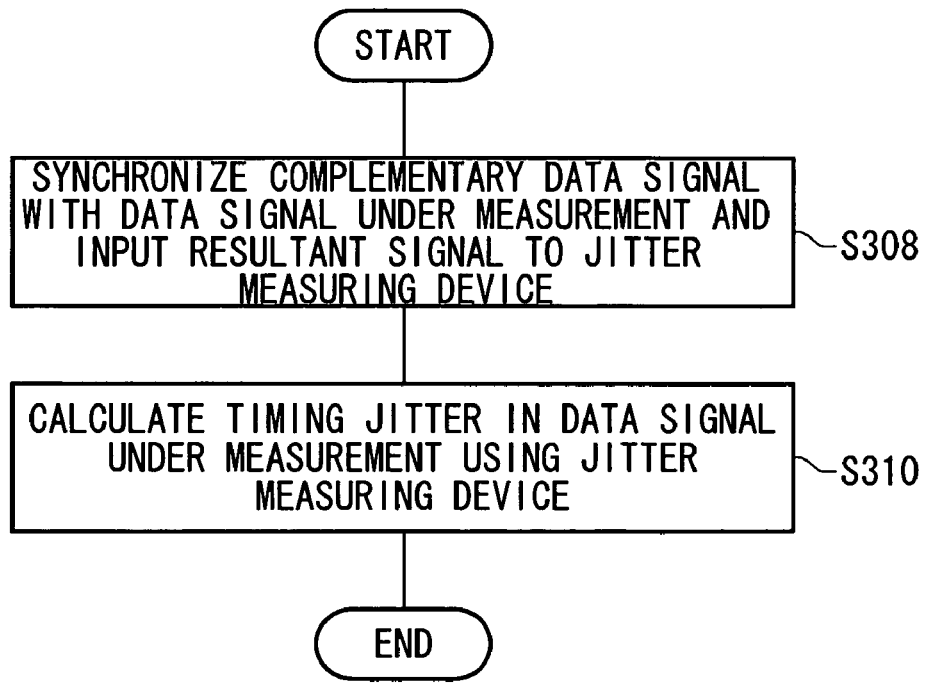
FIG. 22 is a flowchart showing one exemplary method for measuring jitter in the data-signal-under-measurement by using the test apparatus shown in FIG. 21.

FIG. 22 is a flowchart showing one exemplary method for measuring jitter in the data-signal-under-measurement by using the test apparatus 100 shown in FIG. 21. At first, the complementary data signal is inputted to the jitter measuring apparatus (measuring section 106) in synchronism with the data-signal-under-measurement in an input step in S308. Here, the complementary data signal may be given to the test apparatus 100 by generating by an external device or by generating from the data-signal-under-measurement by using the means having the function equivalent to that of the complementary data signal generating section 10 explained in FIG. 1. It is also preferable to carry out a deskewing step of regulating a skew between the data-signal-under-measurement and the complementary data signal in the input step S308. Next, the jitter measuring apparatus calculates the timing jitter in the data-signal-under-measurement based on the inputted complementary data signal and data-signal-under-measurement in a jitter measuring step S310.

The jitter measuring device 98 explained in FIGS. 1 through 19 is a device capable of measuring the data-signal-under-measurement having the random pattern in real-time.

Figure 23:
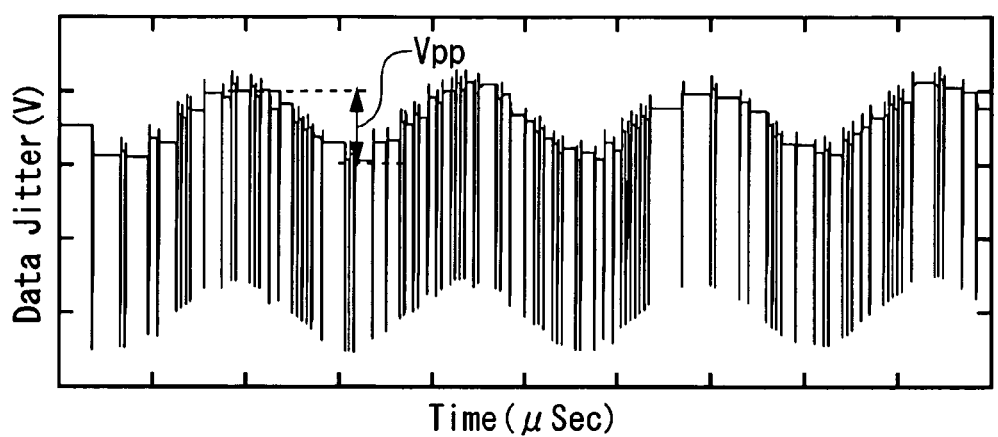
FIG. 23 is a chart showing one exemplary waveform outputted from the judging section 90 in measuring a data-signal-under-measurement modulated by sinusoidal jitter.

FIG. 23 shows one exemplary waveform outputted from the judging section 90 in measuring a data-signal-under-measurement modulated by sinusoidal jitter. Each data transition in the data-signal-under-measurement corresponds to a whisker part protruding out of the waveform shown in FIG. 23. Because the data-signal-under-measurement has the random pattern, the interval between the whisker parts changes at random.

The conventional oscilloscope or the like is required to measure jitter by detecting the whisker parts one by one. Therefore, it was unable to measure jitter in real-time. However, the jitter measuring device 98 takes in the data-signal-under-measurement and integrates the pulse signal corresponding to the data transitions in the data-signal-under-measurement in real-time. Accordingly, it can measure peak-to-peak jitter for example in real-time.

The use of the complementary data signal also enables one to readily measure the jitter in the data sequence under test having the random pattern.

Figure 24:
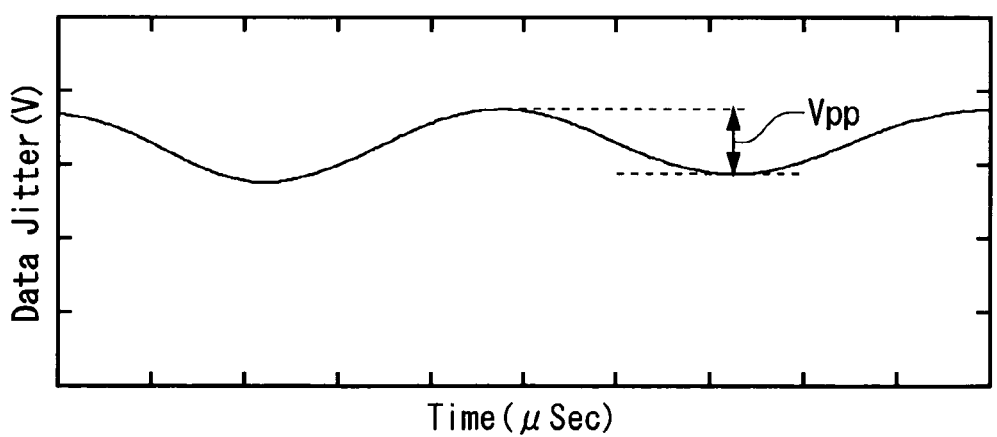
FIG. 24 is a chart showing a waveform from which the high-frequency components in the waveform shown in FIG. 23 are removed.

FIG. 24 shows a waveform from which the high-frequency components as shown in FIG. 23 are removed. The jitter calculating section 70 may have a filter for removing the high-frequency components. The timing jitter in the data-signal-under-measurement may be accurately measured by thus removing the high-frequency noise components from the waveform, which has been output from the low pass filter.

As it is apparent from the above description, the timing jitter in the data-signal-under-measurement having an irregular pattern may be readily and accurately measured by the present invention.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A jitter measuring apparatus for measuring jitter in a signal-under-measurement, comprising:

a pulse generating section having first pulse generating means for detecting edges of said data-signal-under-measurement to output a first pulse signal having a pulse width set in advance corresponding to said edge and second pulse generating means for detecting boundaries of data sections where data values do not change in said data-signal-under-measurement to output a second pulse signal having a pulse width set in advance corresponding to timing of the boundaries of said detected data sections at each of the boundaries of the data sections at each of the boundaries of the data sections of the data-signal-under-measurement; an integrator section for outputting a jitter measuring signal whose signal level increases at a predetermined rate of increment during when the signal outputted from said pulse generating section indicates a first logic value and whose signal level decreases at a predetermined rate of decrement during when the signal outputted from said pulse generating section indicates a second logic value which is different from said first logic value; and a jitter calculating section for calculating timing jitter in said data-signal-under-measurement based on said first pulse signal, second pulse signal and on each of said signal level of said jitter measuring signal outputted from said integrator section at the timing of edge of said pulse signals.

2. The jitter measuring apparatus as set forth in claim 1, further comprising a complementary data signal generating section for generating a complementary data signal having edges at every boundary of the data sections over which data values of said data-signal-under-measurement do not change, that is said data-signal-under-measurement has no edge; wherein said second pulse generating means outputs said second pulse signal corresponding to the edge of said complementary data signal.

3. The jitter measuring apparatus as set forth in claim 2, wherein said complementary data signal generating section generates said complementary data signal by which the edges of said data-signal-under-measurement and of said complementary data signal are arranged at almost equal intervals when they are aligned in the same time axis.

4. The jitter measuring apparatus as set forth in claim 1, wherein said jitter calculating section has:

a sample-and-hold circuit for passing said jitter measuring signal during when said first pulse signal indicates said first logic value and holding the signal level of said jitter measuring signal during when said first pulse signal indicates said second logic value; and a calculating section for calculating said timing jitter based on the signal outputted from said sample-and-hold circuit.

5. The jitter measuring apparatus as set forth in claim 1, wherein said jitter calculating section has:
an AD converter section for receiving said first pulse signal as a conversion triggering signal and converting the signal level of said jitter measuring signal into a discrete value at the edge of said conversion triggering signal; and
a calculating section for calculating said timing jitter based on the digital value outputted from said AD converter section.

6. The jitter measuring apparatus as set forth in claim 1, wherein said data-signal-under-measurement is a signal that repeats an identical data pattern periodically with the period of a pattern cycle set in advance; and
said jitter calculating section has:
a sample-and-hold circuit for passing said jitter measuring signal during when pulses of said first pulse signal whose order is set in advance indicate said first logic value and holding the signal level of said jitter measuring signal during when the pulses do not indicate said first logic value; and
a calculating section for calculating said timing jitter based on the signal outputted from said sample-and-hold circuit.

7. The jitter measuring apparatus as set forth in claim 6, wherein said sample-and-hold circuit sequentially selects the pulse for sampling said jitter measuring signal; and
said calculating section calculates said timing jitter of said selected pulse and further calculates deterministic jitter of said data-signal-under-measurement based on each of said calculated timing jitter.

8. The jitter measuring apparatus as set forth in claim 1, wherein said data-signal-under-measurement is a signal that repeats an identical data pattern periodically with the period of a pattern cycle set in advance;
said jitter measuring apparatus has also a frequency divider for perform frequency division on said data-signal-under-measurement corresponding to a number of data transitions in each pattern period of said data-signal-under-measurement; and
said complementary data signal generating section generates said complementary data signal of said divided data-signal-under-measurement.

9. The jitter measuring apparatus as set forth in claim 1, wherein said pulse generating section generates said pulse signal responding to the change in either or both of the rising edge and falling edge of said data-signal-under-measurement and said complementary data signal.

10. The jitter measuring apparatus as set forth in claim 2, wherein said complementary data signal generating section has:
a clock regenerator for generating a clock signal having the almost uniform period with said data section of said data-signal-under-measurement based on said data-signal-under-measurement;
a first D flip-flop for taking in and outputting said data-signal-under-measurement with each clock signal;
a second D flip-flop for taking in and outputting the signal outputted from said first D flip-flop corresponding to said clock signal;
a coincidence detector for outputting a coincident signal having a logic value H to indicate the state that a value of the signal outputted from said first D flip-flop is equal to a value of the signal outputted from said second D flip-flop;
a third D lip-flop for taking in and outputting the signal outputted from said coincidence detector corresponding to said clock signal and by which internal data is reset; and
a frequency divider for dividing the signal outputted from said third D flip-flop by two to generate said complementary data signal.

11. The jitter measuring apparatus as set forth in claim 2, wherein said complementary data signal generating section has:
a clock regenerator for generating a clock signal having the almost uniform period with said data section of said data-signal-under-measurement based on said data-signal-under-measurement;
a fourth D flip-flop in which said clock signal is applied to a clock input terminal and an inverting output terminal is connected with a data input terminal;
a fifth D flip-flop that takes in and outputs said data-signal-under-measurement corresponding to said clock signal; and
an exclusive OR gate for outputting an exclusive OR of the signal outputted from said fourth D flip-flop and the signal outputted from said fifth D flip-flop as said complementary data signal.

12. The jitter measuring apparatus as set forth in claim 1, wherein said jitter calculating section calculates said timing jitter based on respective extreme values in the varying signal level of said jitter measuring signal.

13. The jitter measuring apparatus as set forth in claim 1, wherein said integrator section generates said jitter measuring signal with said rates of increment and decrement so that the respective extreme values of said jitter measuring signal become the signal level set in advance when said data-signal-under-measurement and said complementary data signal are jitter-free; and
said jitter calculating section calculates said timing jitter based on each of said extreme values of said jitter measuring signal and said signal level set in advance.

14. The jitter measuring apparatus as set forth in claim 1, wherein said jitter calculating section has an averaging circuit for removing high-frequency components set in advance from said jitter measuring signal outputted out of said integrator section.

15. The jitter measuring apparatus as set forth in claim 2, wherein said complementary data signal generating section generates said complementary data signal whose timing jitter is almost zero.

16. A jitter measuring method for measuring jitter in a data-signal-under-measurement comprising:
a first pulse generating step of detecting edges of said data-signal-under-measurement to output a first pulse signal having a pulse width set in advance corresponding to said edges;
a second pulse generating step of detecting boundaries of data sections where data values do not change in said data-signal-under-measurement to output a second pulse signal having a pulse width set in advance corresponding to timing of the boundary of said detected data sections at each of the boundaries of the data sections of the data-signal-under-measurement; an integrating step for outputting a jitter measuring signal whose signal level increases at a predetermined rate of increment during when the signal outputted from said first or second generating step, indicating a first logic value and whose signal level decreases at a predetermined rate of decrement during when the signal outputted from said pulse generating section indicating a second logic value which is different from said first logic value; and a jitter calculating step for calculating timing jitter in said data-signal-under-measurement based on said first pulse signal, second pulse signal and on each of said signal level of said jitter measuring signal outputted from said integrating step at the timing of edge of said pulse signal.

17. A jitter measuring apparatus for measuring jitter in a data-signal-under-measurement, comprising:

a measuring section capable of measuring jitter in a clock signal having pulses almost in the uniform period with a data section of the data-signal-under-measurement; and an input section for receiving a complementary data signal having edges at every boundary of the data sections of said data-signal-under-measurement over which data values of said data-signal-under-measurement do not change and said data-signal-under-measurement and for inputting said data-signal-under-measurement and said complementary data signal in synchronism to said measuring section; an integrating section for outputting a jitter measuring signal whose signal level increases at a predetermined rate of increment during when the signal outputted from said measuring section, indicating a first logic value and whose signal level decreases at a predetermined rate of decrement during when the signal outputted from said measuring section indicating a second logic value which is different from said first logic value; and jitter calculating section calculates said jitter based on each of said signal level of said jitter measuring signal outputted from said integrator section at the timing of edge of said pulse signal.

18. A jitter measuring method for measuring jitter in a data-signal-under-measurement by using a jitter measuring device capable of measuring timing jitter in a given clock signal, comprising:

an input step of inputting a complementary data signal having edges at every boundary of data sections of said data-signal-under-measurement over which data values of said data-signal-under-measurement do not change in said data section in synchronism with said data-signal-under-measurement to said jitter measuring device; an integrating step for outputting a jitter measuring signal whose signal level increases at a predetermined rate of increment during when the signal outputted from said jitter measuring device, indicating a first logic value and whose signal level decreases at a predetermined rate of decrement during when the signal outputted from said jitter measuring device indicating a second logic value which is different from said first logic value; and a jitter calculating step of calculating timing jitter in said data-signal-under-measurement by said jitter measuring device based on said data-signal-under-measurement, said complementary data signal and said jitter measuring signal outputted from said integrator.

19. The jitter measuring method as set forth in claim 18, wherein said input step is a step of inputting said complementary data signal generated by an external device on the outside of said jitter measuring device to said jitter measuring device.

20. The jitter measuring method as set forth in claim 18, wherein said input step includes a skew regulating step of regulating a skew between said data-signal-under-measurement and said complementary data signal.

* * * * *